(12) United States Patent
Huang et al.

(10) Patent No.: US 12,150,309 B2
(45) Date of Patent: Nov. 19, 2024

(54) DOUBLE GATE METAL-FERROELECTRIC-METAL-INSULATOR-SEMICONDUCTOR FIELD-EFFECT TRANSISTOR (MFMIS-FET) STRUCTURE

(71) Applicant: Taiwan Semiconductor Manufacturing Company, Ltd., Hsinchu (TW)

(72) Inventors: Yen-Chieh Huang, Changhua County (TW); Po-Ting Lin, Taichung (TW); Song-Fu Liao, Taipei (TW); Hai-Ching Chen, Hsinchu (TW); Sai-Hooi Yeong, Zhubei (TW); Yu-Ming Lin, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 289 days.

(21) Appl. No.: 17/591,174

(22) Filed: Feb. 2, 2022

(65) Prior Publication Data
US 2023/0247841 A1    Aug. 3, 2023

(51) Int. Cl.
*H01L 29/66* (2006.01)
*H01L 29/08* (2006.01)
(Continued)

(52) U.S. Cl.
CPC ......... *H10B 51/30* (2023.02); *H01L 29/0847* (2013.01); *H01L 29/1033* (2013.01);
(Continued)

(58) Field of Classification Search
CPC . H10B 51/30; H01L 29/0847; H01L 29/1033; H01L 29/42324; H01L 29/516;
(Continued)

(56) References Cited

U.S. PATENT DOCUMENTS 6,054,734 A * 4/2000 Aozasa ................. H10B 41/48
257/317
10,141,414 B1 * 11/2018 Galatage ............... H01L 29/788
(Continued)

OTHER PUBLICATIONS

Gaidhane et al. "Compact Modeling of Drain Current in Double Gate Negative Capacitance MFIS Transistor" 2018 4th IEEE International Conference on Emerging Electronics (ICEE), published on Dec. 23, 2019.

(Continued)

*Primary Examiner* — Sheikh Maruf
(74) *Attorney, Agent, or Firm* — Eschweiler & Potashnik, LLC

(57) ABSTRACT

Various embodiments of the present disclosure are directed towards an integrated chip (IC) comprising a lower gate electrode disposed in a dielectric structure. A first ferroelectric structure overlies the lower gate electrode. A first floating electrode structure overlies the first ferroelectric structure. A channel structure overlies the first floating electrode structure. A second floating electrode structure overlies the channel structure. A second ferroelectric structure overlies the second floating electrode structure. An upper gate electrode overlies the second ferroelectric structure.

20 Claims, 22 Drawing Sheets

(51) Int. Cl.
*H01L 29/10* (2006.01)
*H01L 29/423* (2006.01)
*H01L 29/51* (2006.01)
*H01L 29/78* (2006.01)
*H10B 51/30* (2023.01)

(52) U.S. Cl.
CPC ...... *H01L 29/42324* (2013.01); *H01L 29/516* (2013.01); *H01L 29/6656* (2013.01); *H01L 29/6684* (2013.01); *H01L 29/78391* (2014.09)

(58) Field of Classification Search
CPC ............. H01L 29/6656; H01L 29/6684; H01L 29/78391; H01L 29/42356; H01L 29/7831
USPC ............................................. 257/295; 438/3
See application file for complete search history.

(56) References Cited

U.S. PATENT DOCUMENTS

| | | | | |
|---|---|---|---|---|
| 2001/0054732 | A1* | 12/2001 | Kato | G11C 11/22 257/296 |
| 2002/0043676 | A1* | 4/2002 | Ohtsuka | H10B 53/30 257/295 |
| 2008/0017914 | A1* | 1/2008 | Natori | H10B 41/30 257/315 |
| 2009/0173989 | A1* | 7/2009 | Yaegashi | H10B 41/40 257/E29.165 |
| 2016/0064510 | A1* | 3/2016 | Mueller | H10B 53/30 257/295 |
| 2018/0151583 | A1* | 5/2018 | Lupino | H10B 41/35 |
| 2019/0074363 | A1* | 3/2019 | Zhu | H10B 41/27 |
| 2022/0020747 | A1* | 1/2022 | Liao | H01L 29/78391 |
| 2022/0285506 | A1* | 9/2022 | Zhu | H10B 51/20 |
| 2022/0352091 | A1* | 11/2022 | Yu | H10B 43/50 |
| 2024/0064985 | A1* | 2/2024 | Tsutsumi | H10B 43/50 |

OTHER PUBLICATIONS

Min et al. "MFMIS Negative Capacitance FinFET Design for Improving Drive Current" Electronics 2020, 9, 1423; doi:10.3390/electronics9091423, published on Sep. 2, 2020.
Roy et al. "Sidewall spacer layer engineering for improvement of analog/RF performance of nanoscale double-gate junctionless transistors" Microsyst Technol DOI 10.1007/s00542-016-3049-2, published on Jun. 29, 2016.
Biswas et al. "Atomically flat single terminated oxide substrate surfaces" Progress in Surface Science vol. 92, Issue 2, May 2017, pp. 117-141, published May 2017.
Estandia et al. "Engineering Ferroelectric Hfo.sZro.s02 Thin Films by Epitaxial Stress" ACS Applied Electronic Materials, 1, 1449 (2019). Published in 2019.
Bagdasaryan et al. "A new type of (TiZrNbTaHf)N /MoN nanocomposite coating: Microstructure and properties depending on energy of incident ions" Composites Part B: Engineering, vol. 146. Aug. 1, 2018, pp. 132-144, published Aug. 2018.
Materlik et al. "The origin of ferroelectricity in Hf1-xZrxO2: A computational investigation and a surface energy model" Journal of Applied Physics 117, 134109 (2015), published Apr. 7, 2015.
Dogan et al. "Causes of ferroelect ricit y in HfO2-based thin films: an ab initio perspective" Phl/s. Chem. Chem. Ph~, 2019, 21, 12150-12162, published on May 15, 2019.
Takechi et al. "Depth-profiling XPS analysis of He-plasma treated amorphous InGaZnO thin films for use in top-gate coplanar thin-film transistors" Japanese Journal of Applied Physics 58, 038005 (2019), published on Feb. 11, 2019.
Kwon et al. "Recent progress in high performance and reliable n-type transition metal oxide-based thin film transistors" Semicond. Sci. Technol. 30 (2015) 024002 (16pp), published on Jan. 19, 2015.
Hasegawa, Masakatsu. "Ellingham Diagram" Treatise on Process Metallurgy, published Dec. 2014.
Zan et al. "Achieving High Field-Effect Mobility in Amorphous IndiumGallium-Zinc Oxide by Capping a Strong Reduction Layer" Adv. Mater. 2012. 24, 3509-3514, published in 2012.
Hays et al. "Effect of deposition conditions and composition on band offsets in atomic layer deposited Hf xSi1-xOy on InGaZnO4" J. Vac. Sci. Technol. B 35(1), Jan./Feb. 2017, published Feb. 2017.
Hays et al. "Valence and conduction band offsets in sputtered Hf02/InGaZnO4 heterostructures" Vacuum 116 (2015) 60-6<1, published Mar. 13, 2015.
Robertson, J. "Band structures and band offsets of high K dielectrics on Si" Applied Surface Science I 90 (2002) 2-10, published in 2002.
Hays et al. "Energy band offsets of dielectrics on InGaZnO" Applied Physics Reviews 4, 02 1301 (2017), published on Apr. 18, 2017.
Onaya et al. "Improvement in ferroelectricity of HfxZr 1 _xO 2 thin films using top- and bottom-ZrO2 nucleation layers" APL Mater. 7. 061107 (2019), published on Jun. 27, 2019.
Onaya et al. "Improvement in ferroelectricity of HfxZr1_xO2 thin films using ZrO2 seed layer" Applied Physics Express 10, 081501 (2017), published on Jul. 13, 2017.
Kaneko et al. "Band gap and function engineering for novel functional alloy semiconductors: Bloomed as magnetic properties at room temperature with ~- (Gafe)203" Journal of Applied Physics 113, 23390 1 (2013), published on Jun. 17, 2013.
Ghazanfari et al. "Synthesis, characterization, and X-ray attenuation properties of polyacrylic acid-coated ultrasmall heavy metal oxide (Bi2 0 3 , Yb2 0 3, NaTa03 , Dy 20 3, and Gd 2 0 3 ) nanoparticles as potential CT contrast agents" Colloids and Surfaces A 576 (2019) 73-81, published on May 14, 2019.
Seriani, Nicola. "A relation between kinetic-energy density and the band gap in alkali and alkaline-earth oxides" J. Phy~.: Condens. Maner 22 (2010) 255502 (5pp), published on Jun. 7, 2010.
Lee et al. "Hidden Structura I Order in Orthorhombic Ta2 O5" Phys Rev Lett. Jun. 7, 2013;110(23):235502, published on Jun. 5, 2013.
Cao et al. "Effects of Capping Electrode on Ferroelectric Properties of Hf 0 .5 Zr 0 .5 0 2 Thin Films" IEEE Electron Device Letters, vol. 39, No. 8, Aug. 2018.
A. Uwe Schroeder, et al., Ferroelectricity in Doped Hafnium Oxide: Materials, Properties and Devices, p. 57, Elsevier Ltd. (2019).

\* cited by examiner

DOUBLE GATE METAL-FERROELECTRIC-METAL-INSULATOR-SEMICONDUCTOR FIELD-EFFECT TRANSISTOR (MFMIS-FET) STRUCTURE

BACKGROUND

Many modern electronic devices contain electronic memory configured to store data. Electronic memory may be volatile memory or non-volatile memory. Volatile memory stores data while it is powered, while non-volatile memory is able to keep data when power is removed. Some promising candidates for next generation memory technology utilize ferroelectricity to store data, such as ferroelectric field-effect transistor (FeFET) memory, ferroelectric random-access memory (FeRAM), and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
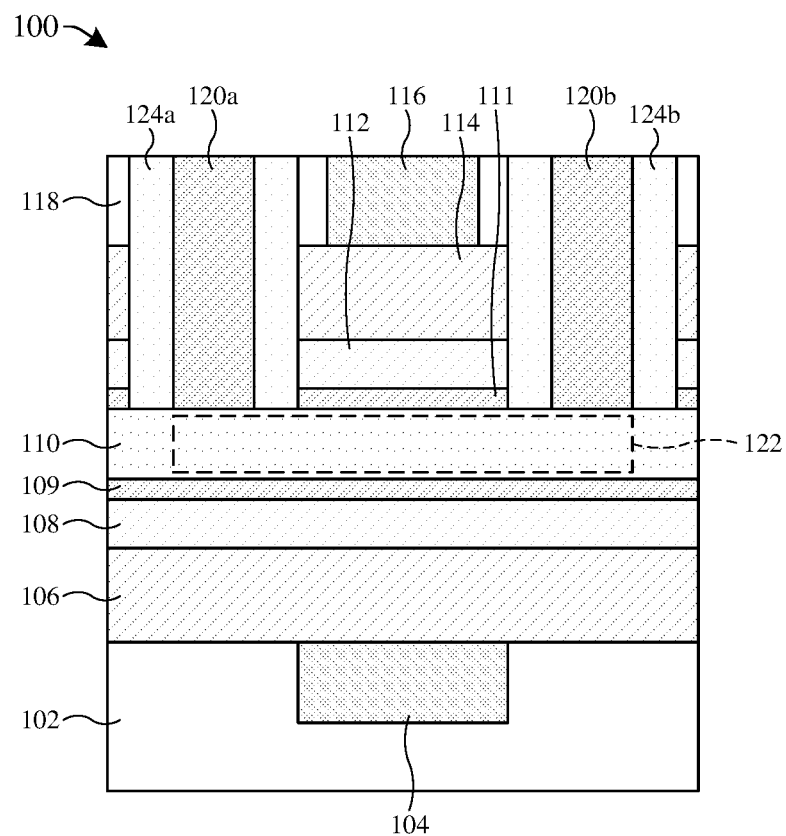
FIG. 1 illustrates a cross-sectional view of some embodiments of an integrated chip (IC) comprising a double gate metal-ferroelectric-metal-insulator-semiconductor field-effect transistor (MFMIS-FET) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) comprise memory devices. For example, some ICs comprise ferroelectric memory devices (e.g., ferroelectric field-effect transistor (FeFET) memory, ferroelectric random-access memory (FeRAM), etc.) that include a plurality of ferroelectric memory cells (e.g., FeFET memory cell, FeRAM memory cell). Some ferroelectric memory cells comprise a gate electrode (e.g., a metal gate), a ferroelectric structure, a channel structure, and a pair of source/drain regions (e.g., metal-ferroelectric-metal-insulator-semiconductor field-effect transistor (MFMIS-FET)). A selectively-conductive channel is disposed in the channel structure and extends laterally between the source/drain regions.

The ferroelectric memory cell is configured to store data (e.g., binary "0" or binary "1") based on a polarization state of the ferroelectric structure. For example, the ferroelectric memory cell may have a high conductive state (e.g., a high conductive ON-state) associated with a first data state (e.g., binary "1") or a low conductive state (e.g., a low conductive OFF-state) associated with a second data state (e.g., binary "0"). In the high conductive state, the ferroelectric structure has a first polarization state (e.g., ferroelectric polarization pointing upward (P-up state)). In the low conductive state, the ferroelectric structure has a second polarization state (e.g., ferroelectric polarization pointing downward (P-down state)).

The ferroelectric memory cell can be programmed into either the high conductive state or the low conductive state by applying corresponding voltages to the gate electrode (e.g., applying corresponding voltages across the ferroelectric structure). For example, a first voltage (e.g., a positive voltage pulse) is applied to the gate electrode to place the ferroelectric structure into the first polarization state, thereby programming the ferroelectric memory cell to the high conductive state. A second voltage (e.g., a negative voltage pulse) is applied to the gate electrode to place the ferroelectric structure into the second polarization state (e.g., switch from the first polarization state to the second polarization state), thereby programming the ferroelectric memory cell to the low conductive state. The ferroelectric memory cell may be read by applying a read voltage to the gate electrode to sense the conductivity of the selectively-conductive channel, thereby determining whether the ferroelectric memory cell is in the high conductive state or the low conductive state (e.g., thereby sensing the current conductive state of the ferroelectric memory cell).

One challenge with the above ferroelectric memory cell is a relatively low ON current (e.g., the current ($I_{ON}$) between the source/drain regions when the ferroelectric memory cell is in the ON-state). The low ON current may negatively affect the performance of the ferroelectric memory device (e.g., the low ON current may cause slow read and/or write speeds). As such, the low ON current may limit the applications in which ferroelectric memory may be employed (e.g., high speed data applications).

Various embodiments of the present disclosure are related to a double gate metal-ferroelectric-metal-insulator-semiconductor field-effect transistor (MFMIS-FET) structure. The double gate MFMIS-FET structure comprises a lower gate electrode disposed in a dielectric structure. A first ferroelectric structure overlies the lower gate electrode. A first floating electrode structure overlies the first ferroelectric structure. A channel structure overlies the first floating electrode structure. A second floating electrode structure overlies the channel structure. A second ferroelectric structure overlies the second floating electrode structure. An upper gate electrode overlies the second ferroelectric structure. A pair of source/drain structures are electrically coupled to the channel structure. A selectively-conductive channel is disposed in the channel structure and extend laterally between the source/drain structures.

In some embodiments, the lower gate electrode is a first gate electrode of the double gate MFMIS-FET, and the upper gate electrode is a second gate electrode of the double gate MFMIS-FET (e.g., the lower gate electrode and the upper gate electrode are configured to control the conductivity of the selectively-conductive channel by setting the polarization state of the first ferroelectric structure and the second ferroelectric structure). For example, the lower gate electrode is utilized (e.g., a voltage pulse applied to the lower gate electrode) to place the first ferroelectric structure into either the first polarization state or the second polarization state, and the upper gate electrode is utilized (e.g., a voltage pulse applied to the upper gate electrode) to place the second ferroelectric structure into either the first polarization state or the second polarization state. As such, the double gate MFMIS-FET can be programmed into either the high conductive state or the low conductive state.

Because the double gate MFMIS-FET comprises the lower gate electrode and the upper gate electrode, the double gate MFMIS-FET may have a high ON current (e.g., the $I_{ON}$ of the double gate MFMIS-FET may be twice as large as a typical MFMIS-FET). In some embodiments, the double gate MFMIS-FET may have the high ON current due to the lower gate electrode and the upper gate electrode being able to place the first ferroelectric structure and the second ferroelectric structure into the same polarization state (e.g., P-up state), thereby resulting in the selectively-conductive channel having a relatively high conductivity (e.g., relatively low resistivity). Accordingly, the double gate MFMIS-FET may increase the applications in which ferroelectric memory may be employed (e.g., high speed data applications).

FIG. 1 illustrates a cross-sectional view 100 of some embodiments of an integrated chip (IC) comprising a double gate metal-ferroelectric-metal-insulator-semiconductor field-effect transistor (MFMIS-FET) structure. In some embodiments, a ferroelectric memory cell of a ferroelectric memory device comprises the double gate MFMIS-FET structure of FIG. 1.

As shown in the cross-sectional view 100 of FIG. 1, the IC comprises a first dielectric layer 102. A lower gate electrode 104 is disposed in the first dielectric layer 102. A first ferroelectric structure 106 is disposed over the lower gate electrode 104. A first floating electrode structure 108 is disposed over the first ferroelectric structure 106. A first insulating structure 109 is disposed over the first floating electrode structure 108. A channel structure 110 is disposed over the first insulating structure 109. The first insulating structure 109 electrically isolates the first floating electrode structure 108 from the channel structure 110.

A second insulating structure 111 is disposed over the channel structure 110. A second floating electrode structure 112 is disposed over the channel structure 110. The second insulating structure 111 electrically isolates the second floating electrode structure 112 from the channel structure 110. A second ferroelectric structure 114 is disposed over the second floating electrode structure 112. An upper gate electrode 116 is disposed over the second ferroelectric structure 114. The upper gate electrode 116 is disposed in a second dielectric layer 118.

A first pair of source/drain (S/D) structures 120 are disposed over the channel structure 110. For example, a first S/D structure 120a and a second S/D structure 120b are disposed over the channel structure 110. The first S/D structure 120a is laterally spaced from the second S/D structure 120b. A selectively-conductive channel 122 is disposed in the channel structure 110 and extends laterally between the first S/D structure 120a and the second S/D structure 120b.

The upper gate electrode 116 is disposed laterally between the first S/D structure 120a and the second S/D structure 120b. The second ferroelectric structure 114 is disposed laterally between the first S/D structure 120a and the second S/D structure 120b. The second floating electrode structure 112 is disposed laterally between the first S/D structure 120a and the second S/D structure 120b. The second insulating structure 111 is disposed laterally between the first S/D structure 120a and the second S/D structure 120b. In some embodiments, portions of the second dielectric layer 118 are disposed laterally between (e.g., directly laterally between) the first pair of S/D structures 120 and the upper gate electrode 116. The first pair of S/D structures 120 extend vertically through the second dielectric layer 118 to the channel structure 110. The first pair of S/D structures 120 are electrically coupled to the channel structure 110.

A first plurality of spacer structures 124 are disposed over the channel structure 110. For example, a first spacer structure 124a and a second spacer structure 124b are disposed over the channel structure 110. The first plurality of spacer structures 124 are disposed along sidewalls of the first pair of S/D structures 120. The first plurality of spacer structures 124 extend vertically along sidewalls of the first pair of S/D structures 120. The first plurality of spacer structures 124 are disposed laterally between the pair or S/D structures 120 and surrounding structural features (e.g., the second ferroelectric structure 114, the second floating electrode structure 112, the upper gate electrode 116, etc.). The first plurality of spacer structures 124 are configured to provide electrical isolation between the pair or S/D structures 120 and the surrounding structural features.

For example, the first spacer structure 124a is disposed along outer sidewalls of the first S/D structure 120a. The first spacer structure 124a extends vertically along the outer sidewalls of the first S/D structure 120a. The first spacer structure 124a is disposed laterally between the first S/D structure 120a and the second floating electrode structure 112 (and the second ferroelectric structure 114), and the first spacer structure 124a electrically isolates the first S/D structure 120a from the second floating electrode structure 112 (and the second ferroelectric structure 114). Likewise, the second spacer structure 124b is disposed along outer sidewalls of the second S/D structure 120b. The second spacer structure 124b extends vertically along the outer sidewalls of the second S/D structure 120b. The second spacer structure 124b is disposed laterally between the second S/D structure 120b and the second floating electrode structure 112 (and the second ferroelectric structure 114), and the second spacer structure 124b electrically isolates the second S/D structure 120b from the second floating electrode structure 112 (and the second ferroelectric structure 114). In some embodiments, the portions of the second dielectric layer 118 are disposed laterally between (e.g., directly laterally between) the first plurality of spacer structures 124 and the upper gate electrode 116. In other embodiments, the first plurality of spacer structures 124 contact (e.g., directly contact) the upper gate electrode 116.

The lower gate electrode 104, the first ferroelectric structure 106, the first floating electrode structure 108, the first insulating structure 109, the channel structure 110, the second insulating structure 111, the second floating electrode structure 112, the second ferroelectric structure 114, the upper gate electrode 116, the first pair of S/D structures 120, and the selectively-conductive channel 122 are parts of a double gate MFMIS-FET structure. The double gate MFMIS-FET structure is configured to store data (e.g., binary "0" or binary "1") based on a polarization state of the first ferroelectric structure 106 and/or a polarization state of the second ferroelectric structure 114. For example, the double gate MFMIS-FET structure may have a high conductive state (e.g., a high conductive ON-state) associated with a first data state (e.g., binary "1") or a low conductive state (e.g., a low conductive OFF-state) associated with a second data state (e.g., binary "0"). In the high conductive state, the first ferroelectric structure 106 and the second ferroelectric structure 114 may have a first polarization state (e.g., P-up state), and thus the selectively-conductive channel 122 has a relatively high conductivity (e.g., relatively low resistivity). In the low conductive state, the first ferroelectric structure 106 and the second ferroelectric structure 114 may have a second polarization state (e.g., P-down state), and thus the selectively-conductive channel 122 has a relatively low conductivity (e.g., relatively high resistivity).

The MFMIS-FET structure can be programmed into either the high conductive state or the low conductive state by applying corresponding voltages to the upper gate electrode 116 and/or the lower gate electrode 104 (e.g., applying a voltage across the second ferroelectric structure 114 and across the first ferroelectric structure 106). In some embodiments, the lower gate electrode 104 is a first gate electrode of the double gate MFMIS-FET, and the upper gate electrode 116 is a second gate electrode of the double gate MFMIS-FET (e.g., the lower gate electrode 104 and the upper gate electrode 116 are configured to control the conductivity of the selectively-conductive channel 122 by setting the polarization state of the first ferroelectric structure 106 and the second ferroelectric structure 114). For example, a first voltage (e.g., a positive voltage pulse) is applied to the upper gate electrode 116 (e.g., via a metal interconnect wire that is electrically coupled to the upper gate electrode 116) to place the second ferroelectric structure 114 into the first polarization state and applied to the lower gate electrode 104 (e.g., via a metal interconnect wire that is electrically coupled to the lower gate electrode 104) to place the first ferroelectric structure 106 into the first polarization state, thereby programming the double gate MFMIS-FET structure to the high conductive state. On the other hand, a second voltage (e.g., a negative voltage pulse) may be applied to the upper gate electrode 116 to place the second ferroelectric structure 114 into the second polarization state (e.g., switch from the first polarization state to the second polarization state) and applied to the lower gate electrode 104 to place the first ferroelectric structure 106 into the second polarization state, thereby programming the double gate MFMIS-FET structure to the low conductive state. The double gate MFMIS-FET structure may be read by applying a read voltage to the upper gate electrode 116 and/or the lower gate electrode 104 to sense the conductivity of the selectively-conductive channel 122, thereby determining whether the double gate MFMIS-FET structure is in the high conductive state or the low conductive state (e.g., thereby sensing the conductive state of the ferroelectric memory cell).

Because the double gate MFMIS-FET comprises the lower gate electrode 104 and the upper gate electrode 116, the double gate MFMIS-FET may have a high ON current (e.g., the current ($I_{ON}$) between the first pair of S/D structures 120 of the double gate MFMIS-FET may be twice as large as a typical MFMIS-FET when in the ON-state). In some embodiments, the double gate MFMIS-FET may have the high ON current due to the lower gate electrode 104 and the upper gate electrode 116 being able to place the first ferroelectric structure 106 and the second ferroelectric structure 114 into the same polarization state (e.g., the first polarization state), thereby resulting in the selectively-conductive channel having a relatively high conductivity (e.g., relatively low resistivity) in comparison to a typical MFMIS-FET. The high ON current may improve the device performance of the ferroelectric memory (e.g., decreased read/write times). As such, the double gate MFMIS-FET may increase the applications in which ferroelectric memory may be employed (e.g., high speed data applications).

Figure 2:
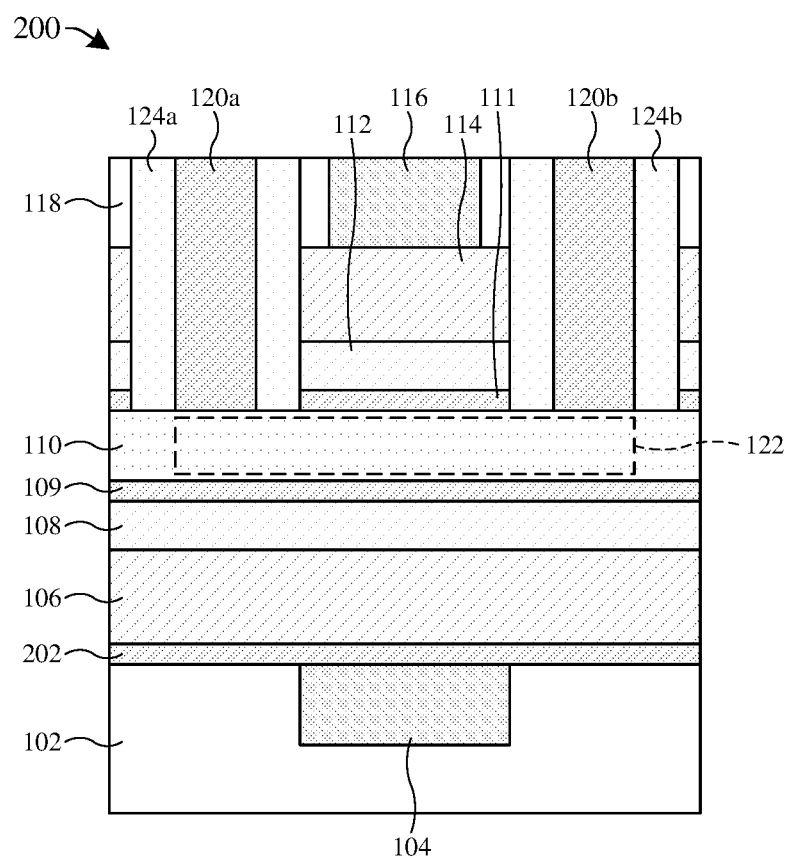
FIG. 2 illustrates a cross-sectional view of some other embodiments of the double gate MFMIS-FET structure of FIG. 1.

FIG. 2 illustrates a cross-sectional view 200 of some other embodiments of the double gate MFMIS-FET structure of FIG. 1.

As shown in the cross-sectional view 200 of FIG. 2, the lower gate electrode 104 is buried in the first dielectric layer 102. In some embodiments, the lower gate electrode 104 has an upper surface that is co-planar with an upper surface of the first dielectric layer 102. The first dielectric layer 102 may be or comprise, for example, a low-k dielectric (e.g., a dielectric material with a dielectric constant less than about 3.9), an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. In some embodiments, the first dielectric layer 102 is an intermetal dielectric (IMD) layer.

The lower gate electrode 104 may be or comprise, for example, platinum (Pt), titanium (Ti), titanium nitride (TiN), tantalum (Ta), tantalum nitride (TaN), tungsten (W), tungsten nitride (WN), gold (Au), iron (Fe), nickel (Ni), beryllium (Be), chromium (Cr), cobalt (Co), antimony (Sb), iridium (Jr), molybendum (Mo), osmium (Os), thorium (Th), vanadium (V), some other metal or metal nitride, or a combination of the foregoing. In some embodiments, the lower gate electrode 104 may have a $a_0$ lattice constant of about 4 angstrom (Å) to about 5 angstrom (Å). In some embodiments, the lower gate electrode 104 may have a thickness between about 50 nanometers (nm) and about 1000 nm.

In some embodiments, a stress layer 202 is disposed over the lower gate electrode 104 and the first dielectric layer 102. In other embodiments, the stress layer 202 is omitted. The stress layer 202 overlies, at least partially, the lower gate electrode 104. The stress layer 202 is configured to apply a tensile stress on the first ferroelectric structure 106. The tensile stress stabilizes the orthorhombic crystal phase (o-phase) of the first ferroelectric structure 106. The stress layer 202 may apply the tensile stress by having a lattice mismatch between the stress layer 202 and the first ferroelectric structure 106 and/or having a different coefficient of thermal expansion (CTE) than the first ferroelectric structure 106. In some embodiments, the tensile stress is an a-axis tensile stress and/or an in-plane tensile stress that is applied to stabilize the o-phase of the first ferroelectric structure 106. In further embodiments, the stress layer 202 is configured to cause, at least partially, a crystal phase transition in the first ferroelectric structure 106 from a [100]-oriented tetragonal grain to a [001]-oriented out-of-plane polarized orthorhombic grain (e.g., due to the stress layer 202 being formed with a predefined set of lattice parameters).

In some embodiments, the stress layer 202 has a different CTE than the first ferroelectric structure 106 (e.g., a lower CTE than the lower gate electrode 104). In some embodiments, the CTE of the stress layer 202 is less than about $4 \times 10^{-6}$/K. In further embodiments, the stress layer 202 applies the tensile stress to the first ferroelectric structure 106 due to a thermal annealing process (e.g., between about 400° C. and about 700° C.) being performed on the stress layer 202. In some embodiments, the stress layer 202 may have a thickness between about 0.5 nm and about 5 nm. The stress layer 202 may be or comprise, for example, tantalum oxide ($Ta_2O_5$), potassium oxide ($K_2O$), rubidium oxide ($Rb_2O$), strontium oxide (SrO), barium oxide (BaO), amorphous vanadium oxide ($a-V_2O_3$), amorphous chromium oxide ($a-Cr_2O_3$), amorphous gallium oxide ($a-Ga_2O_3$), amorphous iron oxide ($Fe_2O_3$), amorphous titanium oxide ($a-Ti_2O_3$), amorphous indium oxide ($a-In_2O_3$), yttrium aluminum oxide ($YAlO_3$), bismuth oxide ($Bi_2O_3$), ytterbium oxide ($Yb_2O_3$), dysprosium oxide ($Dy_2O_3$), gadolinium oxide ($Gd_2O_3$), strontium titanium oxide ($SrTiO_3$), dysprosium scandium oxide ($DyScO_3$), terbium scandium oxide ($TbScO_3$), gadolinium scandium oxide ($GdScO_3$), neodymium scandium oxide ($NdScO_3$), neodymium gallium oxide ($NdGaO_3$), lanthanum strontium aluminum tantalum oxide (LSAT), lanthanum strontium manganese oxide (LSMO), some other material capable of applying a tensile stress to the first ferroelectric structure 106, or a combination of the foregoing. In some embodiments, the stress layer 202 is a bi-layer structure comprising two of the above described materials (e.g., $LSMO/SrTiO_3$, $LSMO/DySCO_3$, $LSMO/TbScO_3$, $LSMO/GdScO_3$, $LSMO/NdScO_3$, $LSMO/NdGaO_3$, LSMO/LSAT, etc.).

In some embodiments, the stress layer 202 may apply about 1.8 percent (%) to about 3.5 percent (%) tensile stress to the first ferroelectric structure 106. If the stress layer 202 applies a tensile stress between about 1.8% and about 3.5%, the o-phase of the first ferroelectric structure 106 may be better stabilized. In some embodiments, the stress layer 202 is epi-$Gd/ScO_3$ with a lattice constant of about 3.91 angstrom (Å) and provides about 2.5% tensile stress to the first ferroelectric structure 106. In further embodiments, the stress layer 202 has a $a_0$ lattice constant that is larger than the in-plane lattice constant of the first ferroelectric structure 106.

The first ferroelectric structure 106 is disposed over the stress layer 202. The first ferroelectric structure 106 overlies, at least partially, the stress layer 202. The first ferroelectric structure 106 overlies, at least partially, the lower gate electrode 104. The first ferroelectric structure 106 may be or comprise, for example, hafnium zirconium oxide (HfZrO), scandium-doped aluminum nitride (AlScN), some other ferroelectric material, or a combination of the foregoing. In some embodiments, the first ferroelectric structure 106 is hafnium zirconium oxide (HfZrO). The first ferroelectric structure 106 may be hafnium zirconium oxide (HfZrO) and comprise oxygen vacancies. In some embodiments, the first ferroelectric structure 106 is hafnium zirconium oxide (HfZrO) that is doped with aluminum (Al), silicon (Si), lanthanum (La), scandium (Sc), calcium (Ca), barium (Ba), gadolinium (Gd), yttrium (Y), strontium (Sr), or the like. In some embodiments, the first ferroelectric structure 106 may have a thickness between about 0.1 nm and about 100 nm.

In some embodiments, the first ferroelectric structure 106 is hafnium zirconium oxide ($Hf_xZr_{1-x}O_y$), where X is between zero (0) and one (1). In further embodiments, the first ferroelectric structure 106 is hafnium zirconium oxide ($Hf_{0.5}Zr_{0.5}O_2$). In yet further embodiments, the first ferroelectric structure 106 may have four different crystal phases: an orthorhombic phase (o-phase), a monoclinic phase (m-phase), a tetragonal phase (t-phase), and a cubic phase (cubic-phase). In yet further embodiments, the monoclinic phase may be less than fifth percent (50%) of a combination of the four crystal phases of the first ferroelectric structure 106.

The first floating electrode structure 108 is disposed over the first ferroelectric structure 106. The first floating electrode structure 108 overlies, at least partially, the first ferroelectric structure 106. The first floating electrode structure 108 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the first floating electrode structure 108 has a thickness between about 1 nm and about 50 nm.

The first insulating structure 109 is disposed over the first floating electrode structure 108. In some embodiments, the first insulating structure 109 is omitted. The first insulating structure 109 overlies, at least partially, the first floating electrode structure 108. The first insulating structure 109 electrically isolates the first floating electrode structure 108 from the channel structure 110. The first insulating structure 109 may be or comprise, for example, hafnium oxide ($HfO_2$), silicon doped hafnium oxide (HSO), hafnium zirconium oxide (HfZrO), silicon oxide ($SiO_2$), aluminum oxide ($Al_2O_3$), yttrium oxide ($Y_2O_3$), zirconium oxide ($ZrO_2$), magnesium oxide (MgO), or the like. In some embodiments, the first insulating structure 109 has a thickness between about 0.1 nm and about 10 nm. In some embodiments, the first insulating structure 109 is silicon doped hafnium oxide (HSO) and comprises at least 10% silicon atoms. In some embodiments, the first insulating structure 109 is a bi-layer structure comprising a silicon doped hafnium oxide (HSO) layer and a hafnium zirconium oxide (HfZrO) layer. In such embodiments, the hafnium zirconium oxide (HfZrO) layer may have a thickness of about 1 nm.

The channel structure 110 is disposed over the first insulating structure 109. The channel structure 110 overlies, at least partially, the first insulating structure 109. In some embodiments, the channel structure 110 is or comprises a semiconductor material. In further embodiments, the channel structure 110 is or comprises, for example, indium gallium zinc oxide (IGZO); amorphous indium gallium zinc oxide (a-IGZO); tin gallium zinc oxide (SnGaZnO); gallium oxide (GaO); indium oxide (InO); zinc oxide (ZnO); gallium arsenide (GaAs); gallium nitride (GaN); aluminum gallium arsenide (AlGaAs); some indium-zinc-oxide compound containing hafnium (Hf), zirconium (Zr), titanium (Ti), aluminum (Al), tantalum (Ta), strontium (Sr), barium (Ba), scandium (Sc), magnesium (Mg), lanthanum (La), gadolinium (Gd); a group III-V semiconductor; a compound semiconductor; amorphous silicon (a-Si); polycrystalline silicon; or some other suitable material. In some embodiments, the channel structure 110 has a thickness of about 3 nm to about 100 nm.

The second insulating structure 111 is disposed over the channel structure 110. The second insulating structure 111 overlies, at least partially, the channel structure 110. In some embodiments, the second insulating structure 111 is omitted. The second insulating structure 111 electrically isolates the channel structure 110 from the second floating electrode structure 112. The second insulating structure 111 may be or comprise, for example, hafnium oxide (HfO$_2$), silicon doped hafnium oxide (HSO), hafnium zirconium oxide (HfZrO), silicon oxide (SiO$_2$), aluminum oxide (Al$_2$O$_3$), yttrium oxide (Y$_2$O$_3$), zirconium oxide (ZrO$_2$), magnesium oxide (MgO), or the like. In some embodiments, the second insulating structure 111 has a thickness between about 0.1 nm and about 10 nm. In some embodiments, the second insulating structure 111 is silicon doped hafnium oxide (HSO) and comprises at least 10% silicon atoms. In some embodiments, the second insulating structure 111 is a bi-layer structure comprising a silicon doped hafnium oxide (HSO) layer and a hafnium zirconium oxide (HfZrO) layer. In such embodiments, the hafnium zirconium oxide (HfZrO) layer may have a thickness of about 1 nm. In some embodiments, the first insulating structure 109 and the second insulating structure 111 comprise a same material(s) and/or have a same thickness. In some embodiments, because the first insulating structure 109 and the second insulating structure 111 comprise a same material(s) and have a same thickness, the double gate MFMIS-FET may be utilized in a redundancy configuration.

The second floating electrode structure 112 is disposed over the second insulating structure 111. The second floating electrode structure 112 overlies, at least partially, the second insulating structure 111. The second floating electrode structure 112 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the second floating electrode structure 112 has a thickness between about 1 nm and about 50 nm. In some embodiments, the second floating electrode structure 112 and the first floating electrode structure 108 comprise a same material(s) and/or have a same thickness. In some embodiments, because the second floating electrode structure 112 and the first floating electrode structure 108 comprise a same material(s) and have a same thickness, the double gate MFMIS-FET may be utilized in a redundancy configuration.

The second ferroelectric structure 114 is disposed over the second floating electrode structure 112. The second ferroelectric structure 114 overlies, at least partially, the second floating electrode structure 112. The second ferroelectric structure 114 may be or comprise, for example, hafnium zirconium oxide (HfZrO), scandium-doped aluminum nitride (AlScN), some other ferroelectric material, or a combination of the foregoing. In some embodiments, the second ferroelectric structure 114 is hafnium zirconium oxide (HfZrO). The second ferroelectric structure 114 may be hafnium zirconium oxide (HfZrO) and comprise oxygen vacancies. In some embodiments, the second ferroelectric structure 114 is hafnium zirconium oxide (HfZrO) that is doped with aluminum (Al), silicon (Si), lanthanum (La), scandium (Sc), calcium (Ca), barium (Ba), gadolinium (Gd), yttrium (Y), strontium (Sr), or the like. In some embodiments, the second ferroelectric structure 114 may have a thickness between about 0.1 nm and about 100 nm.

In some embodiments, the second ferroelectric structure 114 is hafnium zirconium oxide (Hf$_x$Zr$_{1-x}$O$_y$), where X is between zero (0) and one (1). In further embodiments, the second ferroelectric structure 114 is hafnium zirconium oxide (Hf$_{0.5}$Zr$_{0.5}$O$_2$). In yet further embodiments, the second ferroelectric structure 114 may have four different crystal phases: an orthorhombic phase, a monoclinic phase, a tetragonal phase, and a cubic phase. In yet further embodiments, the monoclinic phase may be less than fifth percent (50%) of a combination of the four crystal phases of the second ferroelectric structure 114. In some embodiments, the second ferroelectric structure 114 and the first ferroelectric structure 106 comprise a same material(s) and/or have a same thickness. In some embodiments, because the second ferroelectric structure 114 and the first ferroelectric structure 106 comprise a same material(s) and have a same thickness, the double gate MFMIS-FET may be utilized in a redundancy configuration.

The second dielectric layer 118 is disposed over the second ferroelectric structure 114. In some embodiments, the second dielectric layer 118 overlies, at least partially, the second ferroelectric structure 114. The second dielectric layer 118 may be or comprise, for example, a low-k dielectric (e.g., a dielectric material with a dielectric constant less than about 3.9), an oxide (e.g., SiO$_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. In some embodiments, the second dielectric layer 118 is an IMD layer.

The upper gate electrode 116 is disposed in the second dielectric layer 118. In some embodiments, the upper gate electrode 116 has an upper surface that is substantially coplanar with an upper surface of the second dielectric layer 118. The upper gate electrode 116 overlies, at least partially, the second ferroelectric structure 114. The upper gate electrode 116 may be or comprise, for example, platinum (Pt), titanium (Ti), titanium nitride (TiN), tantalum (Ta), tantalum nitride (TaN), tungsten (W), tungsten nitride (WN), gold (Au), iron (Fe), nickel (Ni), beryllium (Be), chromium (Cr), cobalt (Co), antimony (Sb), iridium (Ir), molybendum (Mo), osmium (Os), thorium (Th), vanadium (V), some other metal or metal nitride, or a combination of the foregoing. In some embodiments, the upper gate electrode 116 may have a $a_0$ lattice constant of about 4 Å to about 5 Å. In some embodiments, the upper gate electrode 116 may have a thickness between about 50 nm and about 1000 nm. In some embodiments, the upper gate electrode 116 and the lower gate electrode 104 comprise a same material(s) and/or have a same thickness. In some embodiments, because the upper gate electrode 116 and the lower gate electrode 104 comprise a same material(s) and have a same thickness, the double gate MFMIS-FET may be utilized in a redundancy configuration.

The first pair of S/D structures 120 overlies the channel structure 110. The first pair of S/D structures 120 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the first pair of S/D structures 120 may have a thickness between about 50 nm and about 1000 nm. For example, the first S/D structure 120a may have a thickness between about 50 nm and about 1000 nm, and the second S/D structure 120b may also have a thickness between about 50 nm and about 1000 nm.

The first plurality of spacer structures 124 overlie, at least partially, the channel structure 110. The first plurality of spacer structures 124 extend vertically along the sidewalls of the first pair of S/D structures 120. In some embodiments, the first plurality of spacer structures 124 extend laterally around the first pair of S/D structures 120, respectively, in closed loop paths. For example, the first spacer structure 124a extends laterally around the first S/D structure 120a in a closed loop path. The first plurality of spacer structures 124 may be or comprise, for example, an oxide (e.g., $SiO_2$), a nitride (e.g., SiN), an oxy-nitride (e.g., SiON), some other dielectric material, or a combination of the foregoing.

Also shown in the cross-sectional view 200 of FIG. 2, the upper gate electrode 116 overlies, at least partially, the second ferroelectric structure 114, the second floating electrode structure 112, the second insulating structure 111, the channel structure 110, the selectively-conductive channel 122, the first insulating structure 109, the first floating electrode structure 108, the first ferroelectric structure 106, the stress layer 202, and/or the lower gate electrode 104. In some embodiments, the lower gate electrode 104 is disposed laterally between the first S/D structure 120a and the second S/D structure 120b. In further embodiments, the lower gate electrode 104 is disposed laterally between the first spacer structure 124a and the second spacer structure 124b.

Figure 3:
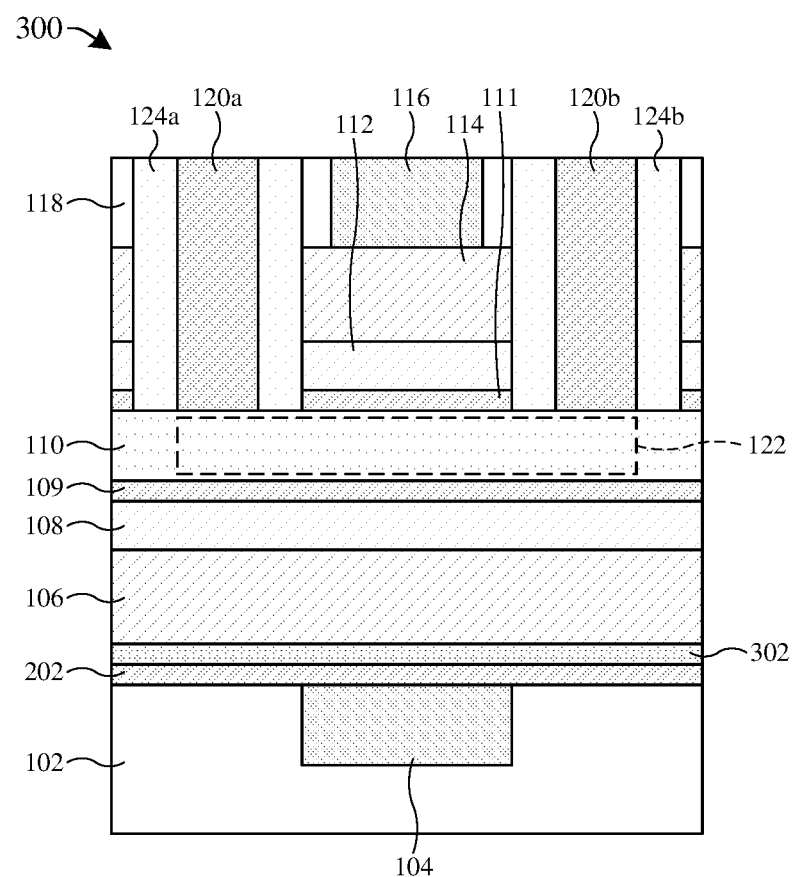
FIG. 3 illustrates a cross-sectional view of some other embodiments of the double gate MFMIS-FET structure of FIG. 2.

FIG. 3 illustrates a cross-sectional view 300 of some other embodiments of the double gate MFMIS-FET structure of FIG. 2.

As shown in the cross-sectional view 300 of FIG. 3, in some embodiments, a first seed layer 302 is disposed vertically between the stress layer 202 and the first ferroelectric structure 106. The first seed layer 302 may improve the polarization (e.g., $2P_r$) of the double gate MFMIS-FET. In some embodiments, the first seed layer 302 is disposed vertically between the lower gate electrode 104 and the first ferroelectric structure 106. The first seed layer 302 may be or comprise, for example, zirconium oxide ($ZrO_2$), yttrium oxide ($Y_2O_3$), zirconium yttrium oxide (ZrYO), hafnium oxide ($HfO_2$), aluminum oxide ($Al_2O_3$), hafnium zirconium oxide ($Hf_xZr_{1-x}O_y$), some other suitable material, or a combination of the foregoing. In some embodiments, the first seed layer 302 may be cubic-phase, t-phase, and/or o-phase zirconium oxide (Zr); cubic-phase, t-phase, and/or o-phase yttrium oxide (ZrYO); cubic-phase, t-phase, and/or o-phase hafnium oxide ($HfO_2$); cubic-phase, t-phase, and/or o-phase aluminum oxide ($Al_2O_3$); or the like. In further embodiments, the first seed layer 302 may have a thickness between about 0.1 nm and about 5 nm. In yet further embodiments, the first seed layer 302 may comprise one or more layers (e.g., a multi-layered seed layer).

Figure 4:
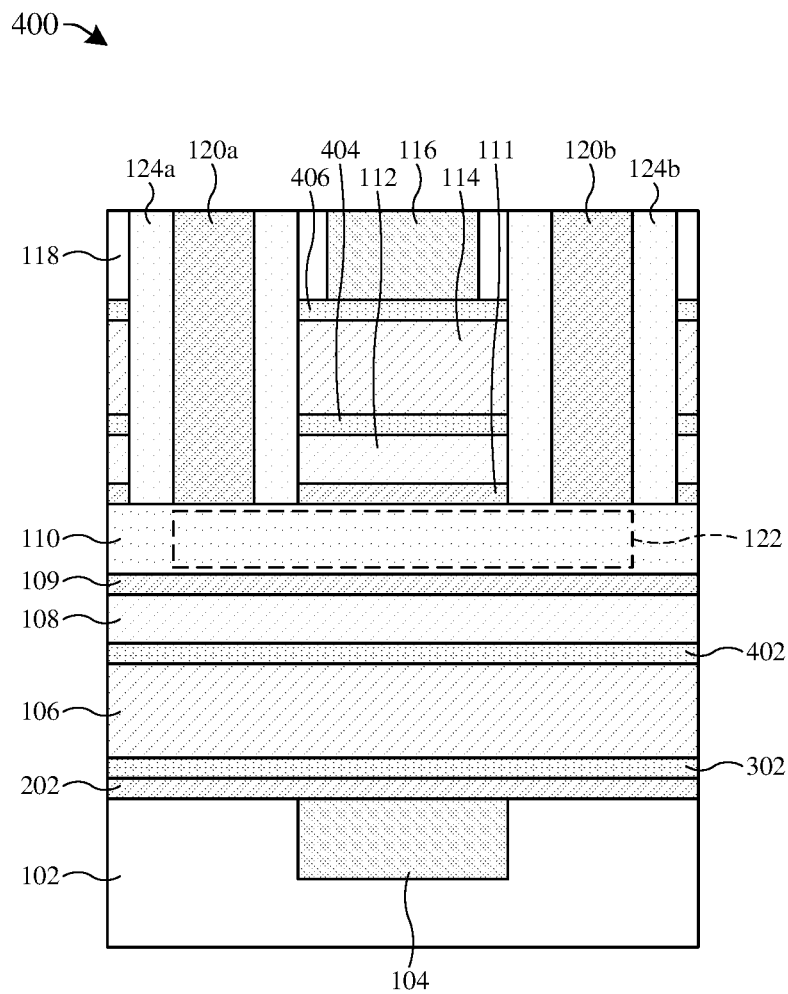
FIG. 4 illustrates a cross-sectional view of some other embodiments of the double gate MFMIS-FET structure of FIG. 3.

FIG. 4 illustrates a cross-sectional view 400 of some other embodiments of the double gate MFMIS-FET structure of FIG. 3.

As shown in the cross-sectional view 400 of FIG. 4, in some embodiments, a second seed layer 402 is disposed vertically between the first ferroelectric structure 106 and the first floating electrode structure 108. In some embodiments, a third seed layer 404 is disposed vertically between the second ferroelectric structure 114 and the second floating electrode structure 112. In some embodiments, a fourth seed layer 406 is disposed vertically between the second ferroelectric structure 114 and the upper gate electrode 116. The second seed layer 402, the third seed layer 404, and the fourth seed layer 406 may further improve the polarization (e.g., $2P_r$) of the double gate MFMIS-FET.

In some embodiments, the second seed layer 402, the third seed layer 404, and the fourth seed layer 406 may be or comprise, for example, zirconium oxide ($ZrO_2$), yttrium oxide ($Y_2O_3$), zirconium yttrium oxide (ZrYO), hafnium oxide ($HfO_2$), aluminum oxide ($Al_2O_3$), hafnium zirconium oxide ($Hf_xZr_{1-x}O_y$), some other suitable material, or a combination of the foregoing. In further embodiments, the second seed layer 402, the third seed layer 404, and the fourth seed layer 406 may be cubic-phase, t-phase, and/or o-phase zirconium oxide (Zr); cubic-phase, t-phase, and/or o-phase yttrium oxide (ZrYO); cubic-phase, t-phase, and/or o-phase hafnium oxide ($HfO_2$); cubic-phase, t-phase, and/or o-phase aluminum oxide ($Al_2O_3$); or the like. In further embodiments, the second seed layer 402, the third seed layer 404, and the fourth seed layer 406 may each have a thickness between about 0.1 nm and about 5 nm. In yet further embodiments, the second seed layer 402, the third seed layer 404, and the fourth seed layer 406 each may comprise one or more layers (e.g., a multi-layered seed layer).

Figure 5:
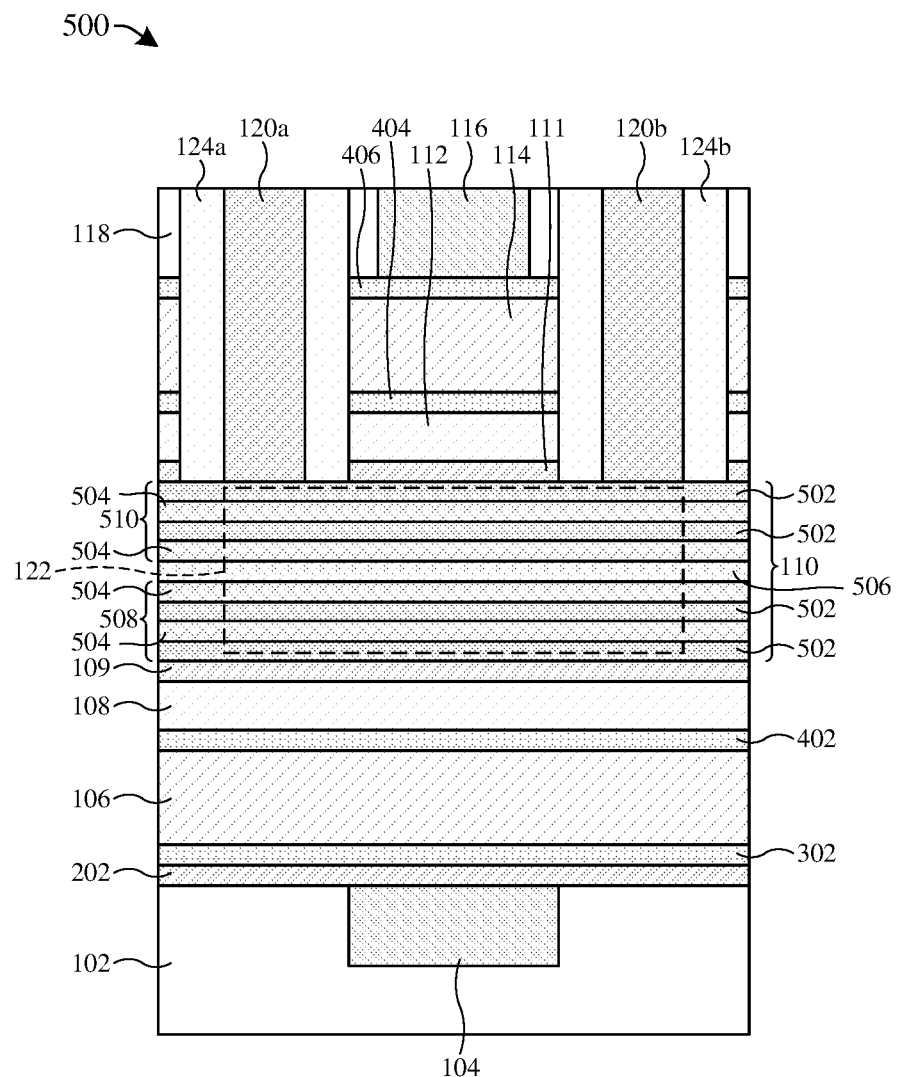
FIG. 5 illustrates a cross-sectional view of some other embodiments of the double gate MFMIS-FET structure of FIG. 4.

FIG. 5 illustrates a cross-sectional view 500 of some other embodiments of the double gate MFMIS-FET structure of FIG. 4.

As shown in the cross-sectional view 500 of FIG. 5, the channel structure 110 comprises a plurality of channel layers. For example, the channel structure 110 comprises a plurality of first channel layers 502, a plurality of second channel layers 504, and a third channel layer 506. The first channel layers 502 comprise a mixture of a first material and a second material. The second channel layers 504 comprise a third material different than the first and second materials. The third channel layer 506 comprises a mixture of the first, second, and third materials. In some embodiments, because the channel structure 110 comprises the plurality of first channel layers 502, the plurality of second channel layers 504, and the third channel layer 506, the double gate MFMIS-FET structure may have improved reliability and switching speeds (e.g., due to the plurality of channel layers reducing defects and increasing charge mobility in the channel structure 110).

The third channel layer 506 is disposed vertically between a first stack 508 of first and second channel layers and a second stack 510 of first and second channel layers. The first stack 508 of first and second channel layers comprises a first set of the first channel layers 502 and a first set of the second channel layers 504, which are stacked vertically in alternating order. The second stack 510 of first and second channel layers comprises a second set of the first channel layers 502 and a second set of the second channel layers 504, which are stacked vertically in alternating order. In some embodiments, a lowermost layer of the first stack 508 of first and second channel layers is one of the plurality of first channel layers 502. In further embodiments, an uppermost layer of the first stack 508 of first and second channel layers is one of the plurality of second channel layers 504. In some embodiments, an uppermost layer of the second stack 510 of first and second channel layers is one of the plurality of first channel layers 502. In some embodiments, a lowermost layer of the second stack 510 of first and second channel layers is one of the plurality of second channel layers 504. While the cross-sectional view 500 of FIG. 5 illustrates the first stack 508 of first and second channel layers and the second stack 510 of first and second channel layers each comprising four layers (two first channel layers 502 and two second channel layers 504), it will be appreciated that the first stack 508 of first and second channel layers and the second stack 510 of first and second channel layers may comprise any number of stacked first and second channel layers.

In some embodiments, the first material comprises gallium oxide (GaO), hafnium oxide (HfO), zirconium oxide (ZrO), titanium oxide (TiO), aluminum oxide (AlO), tantalum oxide (TaO), strontium oxide (SrO), barium oxide (BaO), scandium oxide (ScO), magnesium oxide (MgO), lanthanum oxide (LaO), gadolinium oxide (GdO), or the like. In some embodiments, the second material comprises indium oxide (InO), tin oxide (SnO), arsenic oxide (AsO), zinc oxide (ZnO), or the like. In some embodiments, the third material comprises zinc oxide (ZnO). Thus, for example, in some embodiments, the first material comprises gallium oxide (GaO); the second material comprises indium oxide (InO); and the third material comprises zinc oxide (ZnO), such that the first channel layers 502 comprise a mixture of gallium oxide (GaO) and indium oxide (InO), the second channel layers 504 comprise zinc oxide (ZnO), and the third channel layer 506 is indium gallium zinc oxide (IGZO). In further embodiments, the third channel layer 506 is amorphous indium gallium zinc oxide (a-IGZO).

Figure 6:
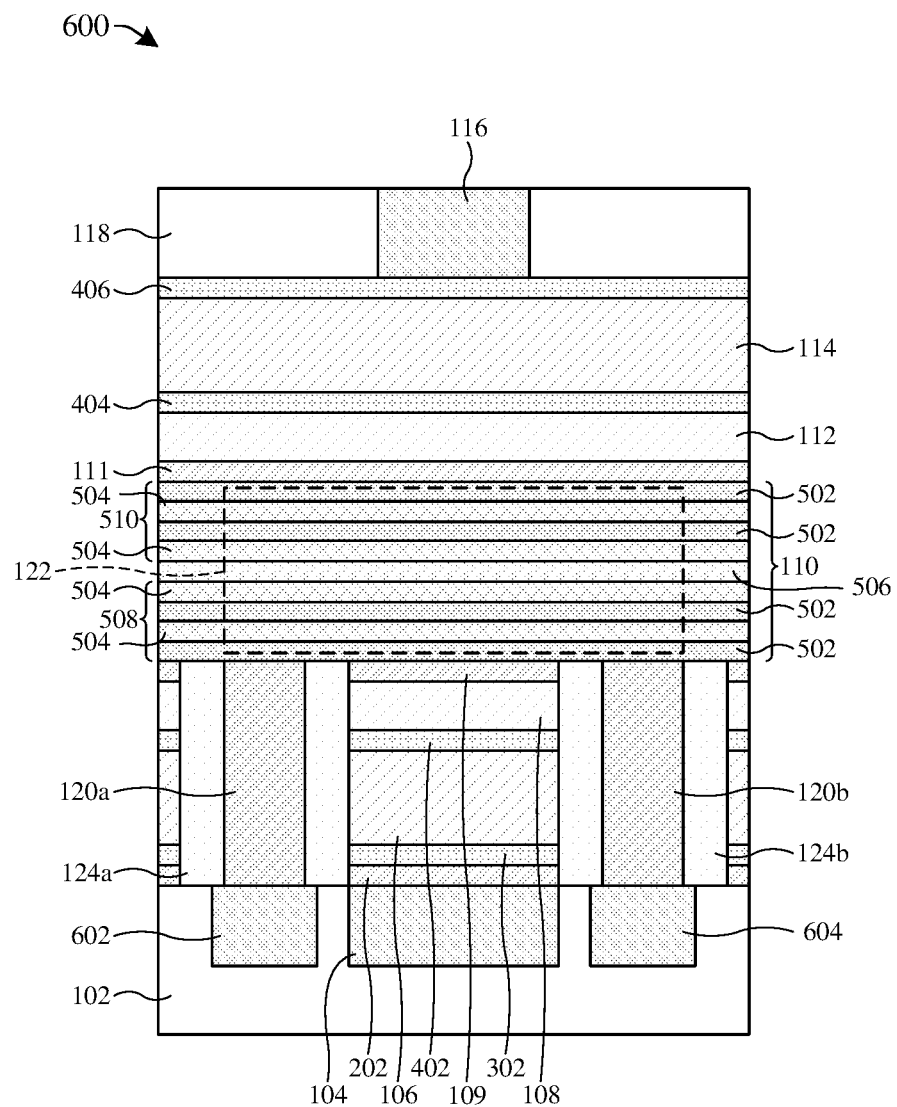
FIG. 6 illustrates a cross-sectional view of some other embodiments of the double gate MFMIS-FET structure of FIG. 5.

FIG. 6 illustrates a cross-sectional view 600 of some other embodiments of the double gate MFMIS-FET structure of FIG. 5.

As shown in the cross-sectional view 600 of FIG. 6, the channel structure 110 may overlie the first pair of S/D structures 120. In some embodiments, the lower gate electrode 104 is disposed laterally between the first S/D structure 120a and the second S/D structure 120b. The stress layer 202 may be disposed laterally between the first S/D structure 120a and the second S/D structure 120b. The first seed layer 302 may be disposed laterally between the first S/D structure 120a and the second S/D structure 120b. The first ferroelectric structure 106 may be disposed laterally between the first S/D structure 120a and the second S/D structure 120b. The second seed layer 402 may be disposed laterally between the first S/D structure 120a and the second S/D structure 120b. The first floating electrode structure 108 may be disposed laterally between the first S/D structure 120a and the second S/D structure 120b. The first insulating structure 109 may be disposed laterally between the first S/D structure 120a and the second S/D structure 120b.

Further, the first spacer structure 124a may laterally separate the first S/D structure 120a from the stress layer 202, the first seed layer 302, the first ferroelectric structure 106, the second seed layer 402, the first floating electrode structure 108, and/or the first insulating structure 109. Likewise, the second spacer structure 124b may laterally separate the second S/D structure 120b from the stress layer 202, the first seed layer 302, the first ferroelectric structure 106, the second seed layer 402, the first floating electrode structure 108, and/or the first insulating structure 109.

A first conductive structure 602 and a second conductive structure 604 are disposed in the first dielectric layer 102. The first S/D structure 120a is electrically coupled to the first conductive structure 602 and the channel structure 110. The second S/D structure 120b is electrically coupled to the second conductive structure 604 and the channel structure 110. In some embodiments, the first conductive structure 602 and the second conductive structure 604 are conductive structures of an interconnect structure (e.g., copper interconnect structure) that is at least partially embedded in the first dielectric layer 102. For example, the first conductive structure 602 may be a conductive via (e.g., metal via) or a conductive wire (e.g., metal wire) of the interconnect structure. In some embodiments, the first conductive structure 602 and the second conductive structure 604 may be or comprise, for example, copper (Cu), aluminum (Al), tungsten (W), tantalum (Ta), titanium (Ti), gold (Au), some other metal, or a combination of the foregoing.

Figure 7:
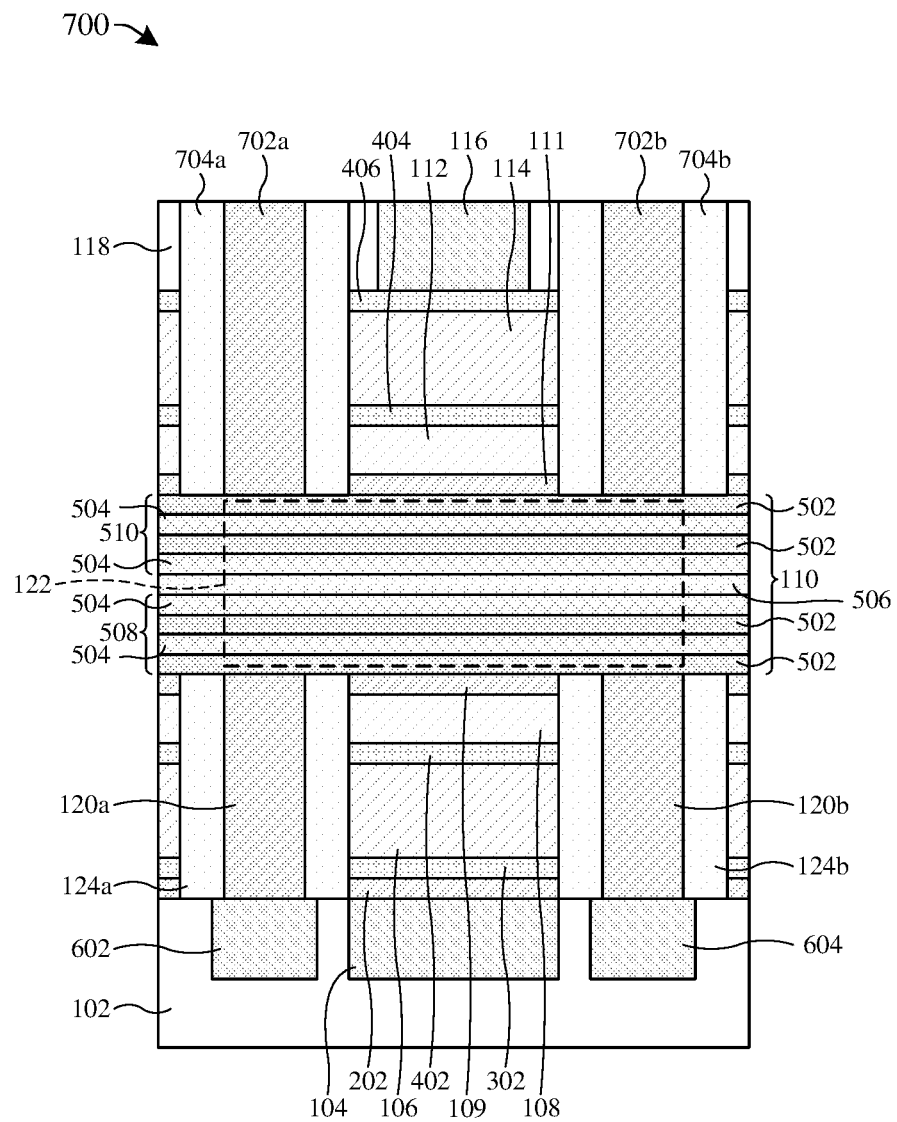
FIG. 7 illustrates a cross-sectional view of some other embodiments of the double gate MFMIS-FET structure of FIG. 6.

FIG. 7 illustrates a cross-sectional view 700 of some other embodiments of the double gate MFMIS-FET structure of FIG. 6.

As shown in the cross-sectional view 700 of FIG. 7, a second pair of S/D structure 702 overlies the channel structure 110. For example, a third S/D structure 702a and a fourth S/D structure 702b overlie the channel structure 110. The third S/D structure 702a is laterally spaced from the fourth S/D structure 702b. The selectively-conductive channel 122 is disposed in the channel structure 110 and extends laterally between the third S/D structure 702a and the fourth S/D structure 702b.

The upper gate electrode 116 is disposed laterally between the third S/D structure 702a and the fourth S/D structure 702b. The second ferroelectric structure 114 is disposed laterally between the third S/D structure 702a and the fourth S/D structure 702b. The second floating electrode structure 112 is disposed laterally between the third S/D structure 702a and the fourth S/D structure 702b. The second insulating structure 111 is disposed laterally between the third S/D structure 702a and the fourth S/D structure 702b. In some embodiments, portions of the second dielectric layer 118 are disposed laterally between (e.g., directly laterally between) the second pair of S/D structures 702 and the upper gate electrode 116. The second pair of S/D structures 702 extend vertically through the second dielectric layer 118 to the channel structure 110. The second pair of S/D structures 702 are electrically coupled to the channel structure 110.

The second pair of S/D structures 702 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the second pair of S/D structures 702 may have a thickness between about 50 nm and about 1000 nm. For example, the third S/D structure 702a may have a thickness between about 50 nm and about 1000 nm.

In some embodiments, the lower gate electrode 104, the stress layer 202, the first seed layer 302, the first ferroelectric structure 106, the second seed layer 402, the first floating electrode structure 108, and/or the first insulating structure 109 are disposed laterally between the third S/D structure 702a and the fourth S/D structure 702b. In further embodiments, the upper gate electrode 116, the fourth seed layer 406, the second ferroelectric structure 114, the third seed layer 404, the second floating electrode structure 112, and/or the second insulating structure 111 are disposed laterally between the first S/D structure 120a and the second S/D structure 120b. In some embodiments, the third S/D structure 702a overlies, at least partially, the first S/D structure 120a. In further embodiments, the fourth S/D structure 702b overlies, at least partially, the second S/D structure 120b.

A second plurality of spacer structures 704 overlie, at least partially, the channel structure 110. For example, a third spacer structure 704a and a fourth spacer structure 704b overlies the channel structure 110. The second plurality of spacer structures 704 are disposed along sidewalls of the second pair of S/D structures 702. The second plurality of spacer structures 704 extend vertically along the sidewalls of the second pair of S/D structures 702. The second plurality of spacer structures 704 are disposed laterally between the pair or S/D structures 702 and surrounding structural features (e.g., the second ferroelectric structure 114, the second floating electrode structure 112, the upper gate electrode 116, etc.). The second plurality of spacer structures 704 are configured to provide electrical isolation between the pair or S/D structures 702 and the surrounding structural features.

For example, the third spacer structure 704a is disposed along outer sidewalls of the third S/D structure 702a. The third spacer structure 704a extends vertically along the outer sidewalls of the third S/D structure 702a. The third spacer structure 704a is disposed laterally between the third S/D structure 702a and the second floating electrode structure 112 (and the second ferroelectric structure 114), and the third spacer structure 704a electrically isolates the third S/D structure 702a from the second floating electrode structure 112 (and the second ferroelectric structure 114). Likewise, the fourth spacer structure 704b is disposed along outer sidewalls of the fourth S/D structure 702b. The fourth spacer structure 704b extends vertically along the outer sidewalls of the fourth S/D structure 702b. The fourth spacer structure 704b is disposed laterally between the fourth S/D structure 702b and the second floating electrode structure 112 (and the second ferroelectric structure 114), and the fourth spacer structure 704b electrically isolates the fourth S/D structure 702b from the second floating electrode structure 112 (and the second ferroelectric structure 114).

In some embodiments, portions of the second dielectric layer 118 are disposed laterally between (e.g., directly laterally between) the second plurality of spacer structures 704 and the upper gate electrode 116. In other embodiments, the second plurality of spacer structures 704 contact (e.g., directly contact) the upper gate electrode 116. In some embodiments, the second plurality of spacer structures 704 extend laterally around the second pair of S/D structures 702, respectively, in closed loop paths. For example, the third spacer structure 704a extends laterally around the third S/D structure 702a in a closed loop path. The second plurality of spacer structures 704 may be or comprise, for example, an oxide (e.g., $SiO_2$), a nitride (e.g., SiN), an oxy-nitride (e.g., SiON), some other dielectric material, or a combination of the foregoing.

In some embodiments, the lower gate electrode 104, the stress layer 202, the first seed layer 302, the first ferroelectric structure 106, the second seed layer 402, the first floating electrode structure 108, and/or the first insulating structure 109 are disposed laterally between the third spacer structure 704a and the fourth spacer structure 704b. In some embodiments, the upper gate electrode 116, the fourth seed layer 406, the second ferroelectric structure 114, the third seed layer 404, the second floating electrode structure 112, and/or the second insulating structure 111 are disposed laterally between the first spacer structure 124a and the second spacer structure 124b. In further embodiments, an outer perimeter of the third spacer structure 704a overlaps an outer perimeter of the first spacer structure 124a (e.g., the third spacer structure 704a overlies, at least partially, the first spacer structure 124a). In yet further embodiments, an outer perimeter of the fourth spacer structure 704b overlaps an outer perimeter of the second spacer structure 124b (e.g., the fourth spacer structure 704b overlies, at least partially, the second spacer structure 124b).

Because the double gate MFMIS-FET comprises the lower gate electrode 104, the upper gate electrode 116, the first pair of S/D structures 120, and the second pair of S/D structures 702, the double gate MFMIS-FET may be utilized in a redundancy configuration (e.g., the upper gate electrode 116 and the second pair of S/D structures 702 are used as a back-up for the lower gate electrode 104 and the first pair of S/D structures 120, or vice versa). As such, the double gate MFMIS-FET may increase the yield of ferroelectric memory devices, thereby lowering the cost to fabricate ferroelectric memory devices. Further, in some embodiments, the double gate MFMIS-FET may still have a high ON current in the redundancy configuration (e.g., due to the double gate MFMIS-FET comprising both the upper and lower gate electrodes). Thus, the double gate MFMIS-FET may lower the cost to fabricate ferroelectric memory and improve the performance of the ferroelectric memory (e.g., decreased read/write times).

Figure 8:
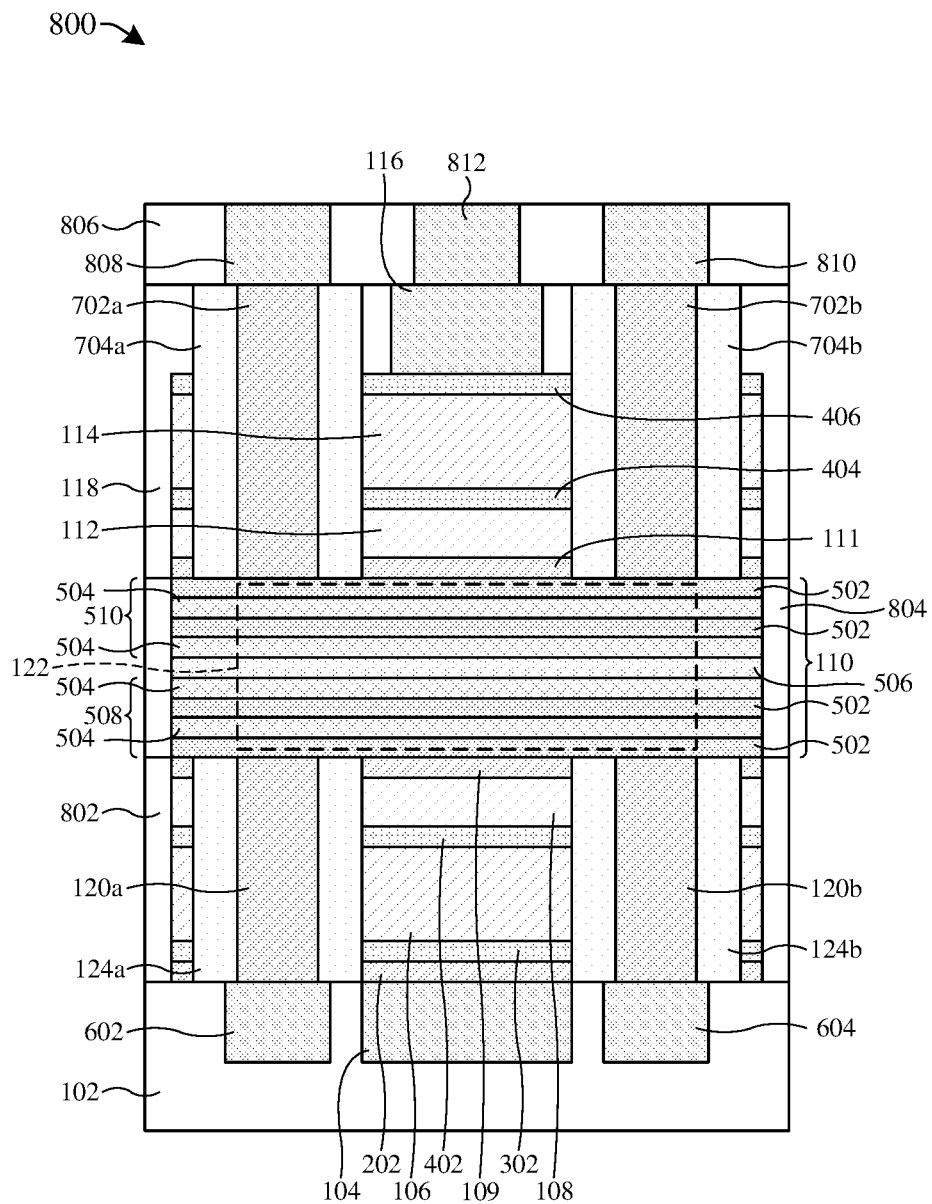
FIG. 8 illustrates a cross-sectional view of some other embodiments of the double gate MFMIS-FET structure of FIG. 7.

FIG. 8 illustrates a cross-sectional view 800 of some other embodiments of the double gate MFMIS-FET structure of FIG. 7.

As shown in the cross-sectional view 800 of FIG. 8, a third dielectric layer 802 is disposed over the first dielectric layer 102. The stress layer 202, the first seed layer 302, the first ferroelectric structure 106, the second seed layer 402, the first floating electrode structure 108, the first insulating structure 109, the first pair of S/D structure 120, and the first plurality of spacer structures 124 may be disposed in the third dielectric layer 802. A fourth dielectric layer 804 is disposed over the third dielectric layer 802. The channel structure 110 may be disposed in the fourth dielectric layer 804. In some embodiments, the upper gate electrode 116, the fourth seed layer 406, the second ferroelectric structure 114, the third seed layer 404, the second floating electrode structure 112, the second insulating structure 111, the second pair of S/D structures 702, and the second plurality of spacer structures 704 may be disposed in the second dielectric layer 118.

In some embodiments, a fifth dielectric layer 806 overlies the second dielectric layer 118. A third conductive structure 808, a fourth conductive structure 810, and a fifth conductive structure 812 are disposed in the fifth dielectric layer 806. The third S/D structure 702a is electrically coupled to the third conductive structure 808 and the channel structure 110. The fourth S/D structure 702b is electrically coupled to the fourth conductive structure 810 and the channel structure 110. The fifth conductive structure 812 is electrically coupled to the upper gate electrode 116. In some embodiments, the third conductive structure 808, the fourth conductive structure 810, and the fifth conductive structure 812 are conductive structures of the interconnect structure (e.g., the copper interconnect structure) that is at least partially embedded in the first dielectric layer 102, the second dielectric layer 118, the third dielectric layer 802, the fourth dielectric layer 804, and the fifth dielectric layer 806. For example, the third conductive structure 808 may be a conductive via (e.g., metal via) or a conductive wire (e.g., metal wire) of the interconnect structure.

In some embodiments, the third conductive structure 808, the fourth conductive structure 810, and the fifth conductive structure 812 may be or comprise, for example, copper (Cu), aluminum (Al), tungsten (W), tantalum (Ta), titanium (Ti), gold (Au), some other metal, or a combination of the foregoing. The third dielectric layer 802, the fourth dielectric layer 804, and the fifth dielectric layer 806 may be or comprise, for example, a low-k dielectric (e.g., a dielectric material with a dielectric constant less than about 3.9), an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. In some embodiments, the third dielectric layer 802, the fourth dielectric layer 804, and the fifth dielectric layer 806 may be IMD layers.

Also shown in the cross-sectional view 800 of FIG. 8, in some embodiments, a first plurality of remnant structures are disposed on opposite sides of the first pair of S/D structures 120. The first plurality of remnant structures are a same material as corresponding structural features disposed laterally between the first S/D structure 120a and the second S/D structure 120b. For example, the first plurality of remnant structures comprise first, second, third, and fourth remnant structures. The first remnant structure and the third remnant structure are disposed on a first side of the first S/D structure 120a, and the second remnant structure and the fourth remnant structure are disposed on a second side of the second S/D structure 120b opposite the first side of the first S/D structure 120a. The first remnant structure, the second remnant structure, and the first ferroelectric structure 106 are disposed in a first lateral plane; and the third remnant structure, the fourth remnant structure, and the first floating electrode structure 108 are disposed in a second lateral plane. As such, the first remnant structure and the second remnant structure corresponds to the first ferroelectric structure 106, and the third remnant structure and the fourth remnant structure correspond to the first floating electrode structure 108. Accordingly, the first remnant structure and the second remnant structure comprise a same material as the first ferroelectric structure 106, and the third remnant structure and the fourth remnant structure comprise a same material as the first floating electrode structure 108.

Also shown in the cross-sectional view 800 of FIG. 8, in some embodiments, a second plurality of remnant structures are disposed on opposite sides of the second pair of S/D structures 702. The second plurality of remnant structures are a same material as corresponding structural features disposed laterally between the third S/D structure 702a and the fourth S/D structure 702b. For example, the second plurality of remnant structures comprise fifth, sixth, seventh, and eighth remnant structures. The fifth remnant structure and the seventh remnant structure are disposed on a first side of the third S/D structure 702a, and the sixth remnant structure and the eighth remnant structure are disposed on a second side of the fourth S/D structure 702b opposite the first side of the third S/D structure 702a. The fifth remnant structure, the sixth remnant structure, and the second ferroelectric structure 114 are disposed in a third lateral plane; and the seventh remnant structure, the eighth remnant structure, and the second floating electrode structure 112 are disposed in a fourth lateral plane. As such, the fifth remnant structure and the sixth remnant structure corresponds to the second ferroelectric structure 114, and the seventh remnant structure and the eighth remnant structure correspond to the second floating electrode structure 112. Accordingly, the fifth remnant structure and the sixth remnant structure comprise a same material as the second ferroelectric structure 114, and the seventh remnant structure and the eighth remnant structure comprise a same material as the second floating electrode structure 112.

Figure 9B:
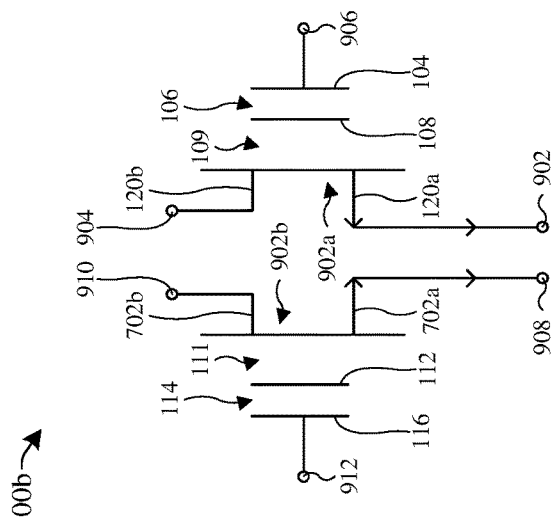
FIGS. 9A-9B illustrate various views of some embodiments of the double gate MFMIS-FET structure of FIG. 8.
Figure 9A:
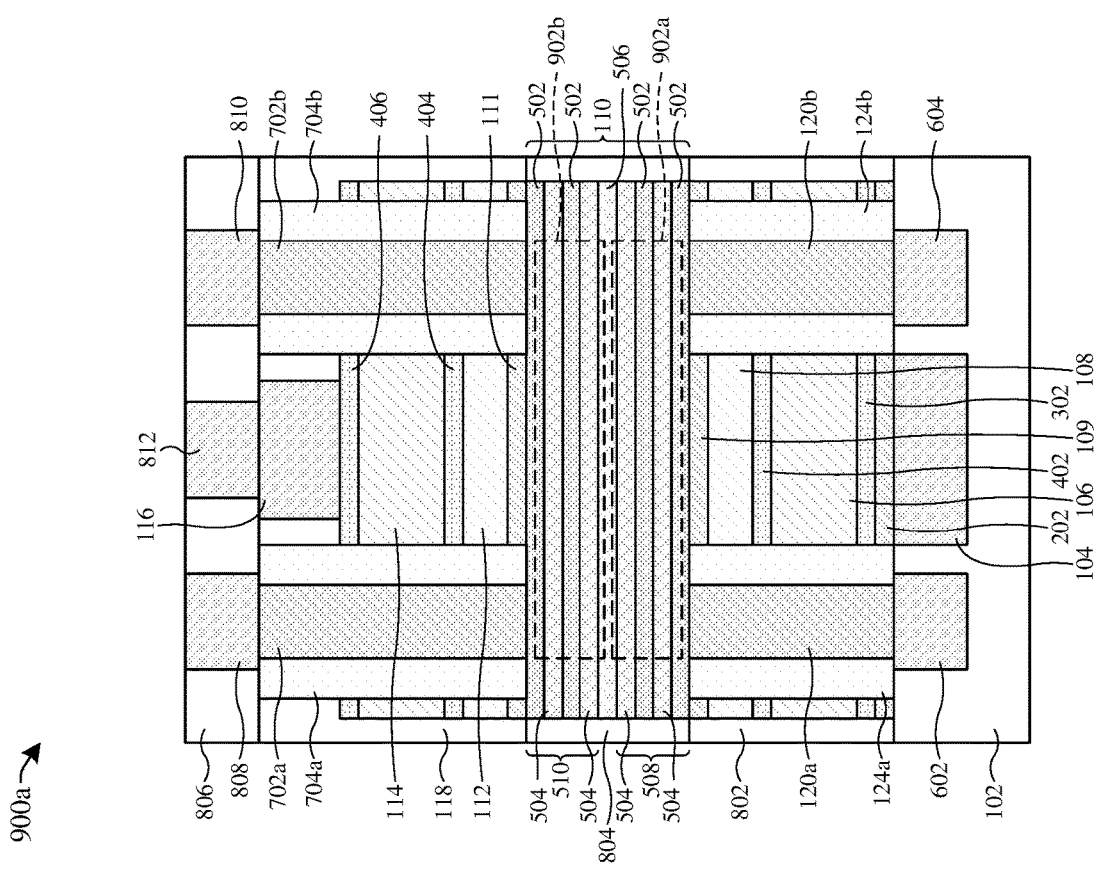

FIGS. 9A-9B illustrate various views of some embodiments of the double gate MFMIS-FET structure of FIG. 8. More specifically, FIG. 9A illustrates a cross-sectional view 900a of some embodiments of the double gate MFMIS-FET structure of FIG. 8, and FIG. 9B illustrates a circuit diagram 900b of an equivalent circuit of the double gate MFMIS-FET structure illustrated in FIG. 9A.

As shown in the cross-sectional view 900a of FIG. 9A, a first selectively-conductive channel 902a and a second selectively-conductive channel 902b are disposed in the channel structure 110. The first selectively-conductive channel 902a extends laterally between the first S/D structure 120a and the second S/D structure 120b. The first selectively-conductive channel 902a is configured to selectively provide an electrical path between the first S/D structure 120a and the second S/D structure 120b. The second selectively-conductive channel 902b extends laterally between the third S/D structure 702a and the fourth S/D structure 702b. The second selectively-conductive channel 902b is configured to selectively provide an electrical path between the third S/D structure 702a and the fourth S/D structure 702b.

As shown in the circuit diagram 900b of FIG. 9B, the equivalent circuit has a first source terminal 902, a first drain terminal 904, a first gate terminal 906, a second source terminal 908, a second drain terminal 910, and a second gate terminal 912. In some embodiments, the first source terminal 902 corresponds to, or is electrically coupled to, the first S/D structure 120a. In some embodiments, the first drain terminal 904 corresponds to, or is electrically coupled to, the second S/D structure 120b. In some embodiments, the first gate terminal 906 corresponds to, or is electrically coupled to, the lower gate electrode 104. In some embodiments, the second source terminal 908 corresponds to, or is electrically coupled to, the third S/D structure 702a. In some embodiments, the second drain terminal 910 corresponds to, or is electrically coupled to, the fourth S/D structure 702b. In some embodiments, the second gate terminal 912 corresponds to, or is electrically coupled to, the upper gate electrode 116. In some embodiments, the equivalent circuit illustrated in the circuit diagram 900b of FIG. 9B may be referred to as a separated FeFET circuit.

While the circuit diagram 900b of FIG. 9B illustrates the first selectively-conductive channel 902a and the second selectively-conductive channel 902b as electrically isolated from one another (e.g., a depletion region exists between the first and second selectively-conductive channel), it will be appreciated that, in some embodiments, the first selectively-conductive channel 902a and the second selectively-conductive channel 902b are a single selectively-conductive channel (see, e.g., FIG. 8). In embodiments in which the first selectively-conductive channel 902a and the second selectively-conductive channel 902b are a single selectively-conductive channel, the channel structure 110 may have a thickness that is less than about 60 nm (e.g., the channel structure 110 thickness is such that the single selectively-conductive channel meets a fully-depleted condition).

Figure 10:
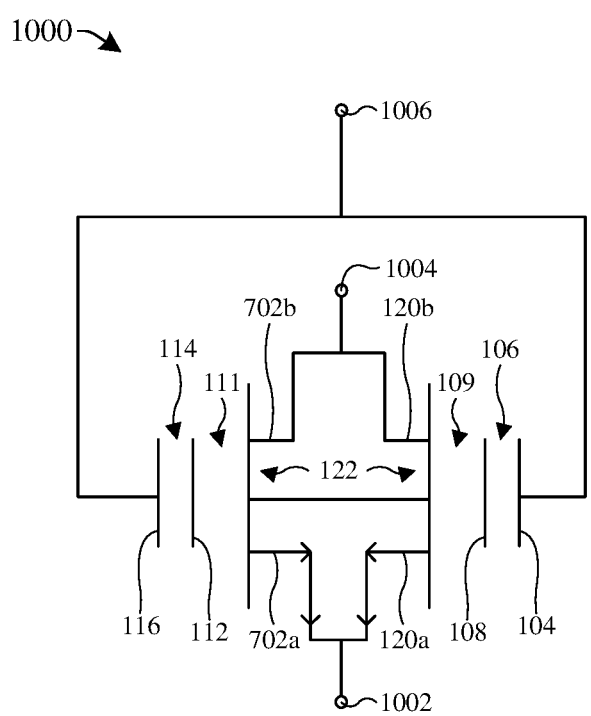
FIG. 10 illustrates a circuit diagram of an equivalent circuit of some other embodiments of the double gate MFMIS-FET structure of FIG. 8.

FIG. 10 illustrates a circuit diagram 1000 of an equivalent circuit of some other embodiments of the double gate MFMIS-FET structure of FIG. 8.

As shown in the circuit diagram 1000 of FIG. 10, the equivalent circuit has a source terminal 1002, a drain terminal 1004, and a gate terminal 1006. In some embodiments, the source terminal 1002 is electrically coupled to, or corresponds to, both the first S/D structure 120a and the third S/D structure 702a. In some embodiments, the drain terminal 1004 is electrically coupled to, or corresponds to, both the second S/D structure 120b and the fourth S/D structure 702b. In some embodiments, the gate terminal 1006 is electrically coupled to, or corresponds to, both the lower gate electrode 104 and the upper gate electrode 116. In some embodiments, the equivalent circuit illustrated in the circuit diagram 1000 of FIG. 10 may be referred to as a common gate control circuit (e.g., due to both the lower gate electrode 104 and the upper gate electrode 116 being electrically coupled together).

Figure 11:
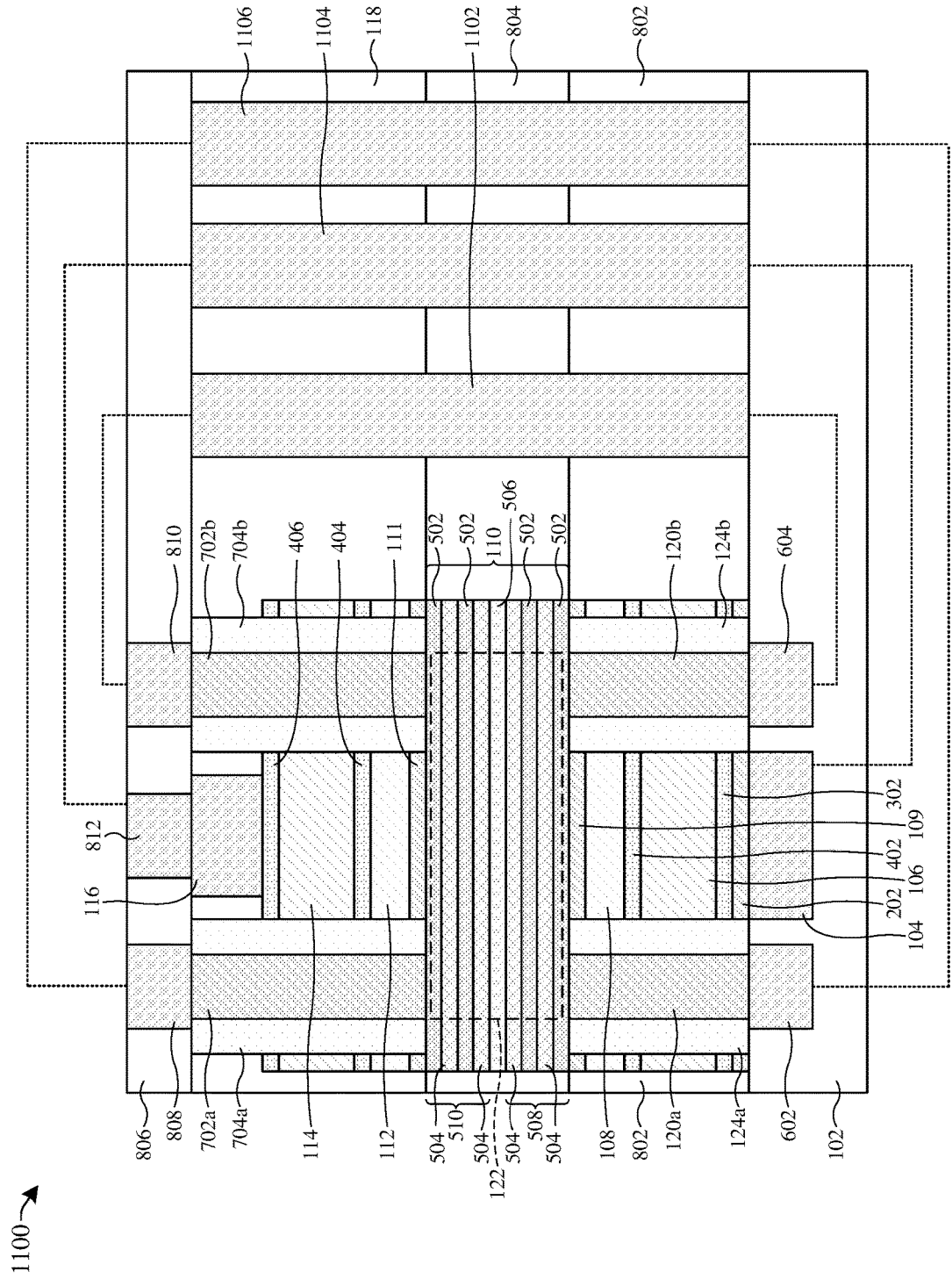
FIG. 11 illustrates a cross-sectional view of some other embodiments of the double gate MFMIS-FET structure of FIG. 8.

FIG. 11 illustrates a cross-sectional view 1100 of some other embodiments of the double gate MFMIS-FET structure of FIG. 8.

As shown in the cross-sectional view 1100 of FIG. 11, a sixth conductive structure 1102, a seventh conductive structure 1104, and an eighth conductive structure 1106 are disposed in the second dielectric layer 118, the third dielectric layer 802, and the fourth dielectric layer 804. The sixth conductive structure 1102, the seventh conductive structure 1104, and the eighth conductive structure 1106 extend vertically through the second dielectric layer 118, the third dielectric layer 802, and the fourth dielectric layer 804. It will be appreciated that, in some embodiments, the sixth conductive structure 1102, the seventh conductive structure 1104, and the eighth conductive structure 1106 may be disposed in the first dielectric layer 102 and/or the fifth dielectric layer 806.

The sixth conductive structure 1102 is electrically coupled to both the second conductive structure 604 and the fourth conductive structure 810 (illustrated by dotted lines in FIG. 11). As such, the fourth S/D structure 702b is electrically coupled to the second S/D structure 120b by, at least partially, the sixth conductive structure 1102. The seventh conductive structure 1104 is electrically coupled to both the lower gate electrode 104 and the fifth conductive structure 812 (illustrated by dotted lines in FIG. 11). As such, the lower gate electrode 104 is electrically coupled to upper gate electrode 116 by, at least partially, the seventh conductive structure 1104. The eighth conductive structure 1106 is electrically coupled to both the first conductive structure 602 and the third conductive structure 808 (illustrated by dotted lines in FIG. 11). As such, the third S/D structure 702a is electrically coupled to the first S/D structure 120a by, at least partially, the eighth conductive structure 1106. It will be appreciated that the double gate MFMIS-FET structure of FIG. 11 illustrates some structural embodiments of the double gate MFMIS-FET structure connected in a separated FeFET circuit configuration.

FIGS. 12-28 illustrate a series of cross-sectional views 1200-2800 of some embodiments of a method for forming an integrated chip (IC) comprising a double gate metal-ferroelectric-metal-insulator-semiconductor field-effect transistor (MFMIS-FET) structure.

Although FIGS. 12-28 are described with reference to a method, it will be appreciated that the structures shown in FIGS. 12-28 are not limited to the method but rather may stand alone separate of the method.

Figure 12:
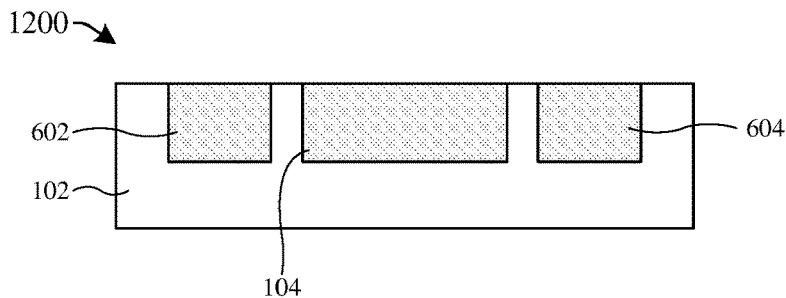
FIGS. 12-28 illustrate a series of cross-sectional views of some embodiments of a method for forming an integrated chip (IC) comprising a double gate metal-ferroelectric-metal-insulator-semiconductor field-effect transistor (MFMIS-FET) structure.

As shown in cross-sectional view 1200 of FIG. 12, a lower gate electrode 104 is formed in a first dielectric layer 102. In some embodiments, a process for forming the lower gate electrode 104 comprises: forming an opening in the first dielectric layer (e.g., via a photolithography/etching process); depositing a conductive layer in the opening and over an upper surface of the first dielectric layer 102; and planarizing the conductive layer to localize the conductive layer to the opening. Other suitable processes are, however, amenable. The conductive layer may be deposited by, for example, chemical vapor deposition (CVD), physical vapor deposition (PVD), atomic layer deposition (ALD), sputtering, electrochemical plating, electroless plating, some other deposition process, or a combination of the foregoing. It will be appreciated that, in some embodiments, the lower gate electrode 104 and the first dielectric layer 102 are as described in the aforementioned figures. It will also be appreciated that the lower gate electrode 104 is formed so that the lower gate electrode 104 is electrically coupled to an underlying conductive feature (e.g., a conductive feature of a copper interconnect structure).

Also shown in the cross-sectional view 1200 of FIG. 12, a first conductive structure 602 and a second conductive structure 604 are formed in the first dielectric layer 102. In some embodiments, the first conductive structure 602 and the second conductive structure 604 are formed in a substantially similar manner as the lower gate electrode 104. It will be appreciated that, in some embodiments, the first conductive structure 602 and the second conductive structure 604 are as described in the aforementioned figures. It will also be appreciated that the first conductive structure 602 and the second conductive structure 604 are formed so that the first conductive structure 602 and the second conductive structure 604 are electrically coupled to underlying conductive features, respectively (e.g., conductive features of the copper interconnect structure).

Figure 13:
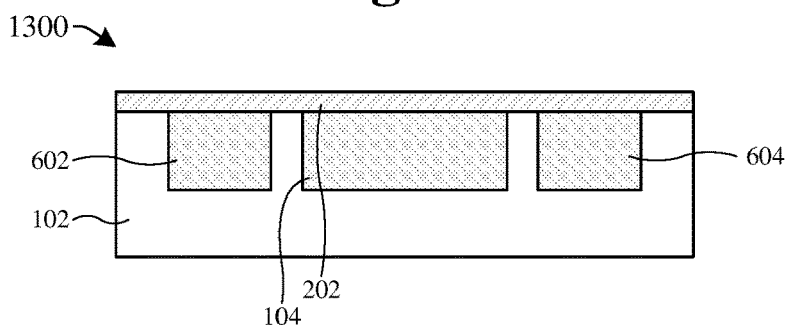

As shown in cross-sectional view 1300 of FIG. 13, a stress layer 202 is formed over the lower gate electrode 104 and the first dielectric layer 102. In some embodiments, formation of the stress layer 202 is omitted. The stress layer 202 is configured to apply a tensile stress on a subsequently formed ferroelectric layer (e.g., to stabilize the orthorhombic crystal phase (o-phase) of the subsequently formed ferroelectric layer). In some embodiments, a process for forming the stress layer 202 comprises depositing the stress layer 202 on the lower gate electrode 104 and the first dielectric layer 102. In further embodiments, the stress layer may be deposited on the first conductive structure 602 and/or the second conductive structure 604. The stress layer 202 may be deposited by, for example, CVD, PVD, ALD, pulsed laser deposition (PLD), some other deposition process, or a combination of the foregoing. In some embodiments, the PLD process deposits quasi-monocrystalline metal oxides.

In some embodiments, the process for forming the stress layer 202 comprises performing an annealing process (e.g., furnace anneal, rapid thermal annealing (RTA), etc.) to enhance the crystallinity of the stress layer 202. In some embodiments, the annealing process is an in-situ (e.g., occurring in the same processing chamber as the stress layer 202 is deposited) thermal annealing process. The in-situ thermal annealing may be, for example, performed between about 400° C. and about 700° C. In some embodiments, the in-situ thermal annealing may be, for example, performed for between about 0.5 minutes and about 10 minutes. It will be appreciated that, in some embodiments, the stress layer 202 is as described in the aforementioned figures.

Figure 14:
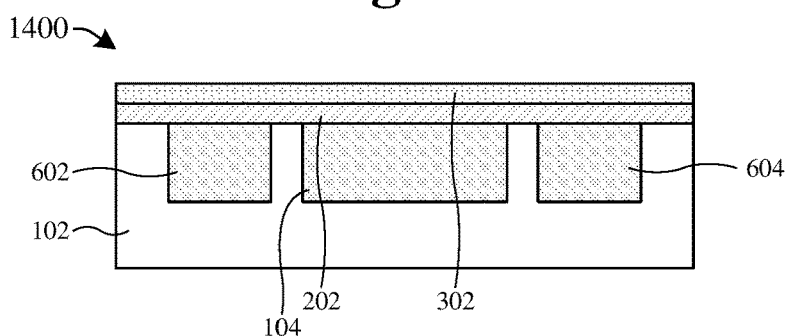

As shown in cross-sectional view 1400 of FIG. 14, a first seed layer 302 is formed over the stress layer 202. In some embodiments, formation of the first seed layer 302 is omitted. In some embodiments, a process for forming the first seed layer 302 comprises depositing the first seed layer 302 on the stress layer 202. The first seed layer 302 may be deposited by, for example, CVD, PVD, ALD, some other deposition process, or a combination of the foregoing.

In some embodiments, the process for forming the first seed layer 302 comprises performing an annealing process (e.g., furnace anneal, rapid thermal annealing (RTA), etc.) on the first seed layer 302. In some embodiments, the annealing process is an in-situ thermal annealing process. The in-situ thermal annealing may be, for example, performed between about 400° C. and about 700° C. In some embodiments, the in-situ thermal annealing may be, for example, performed for between about 0.5 minutes and about 10 minutes. It will be appreciated that, in some embodiments, the first seed layer 302 is as described in the aforementioned figures.

Figure 15:
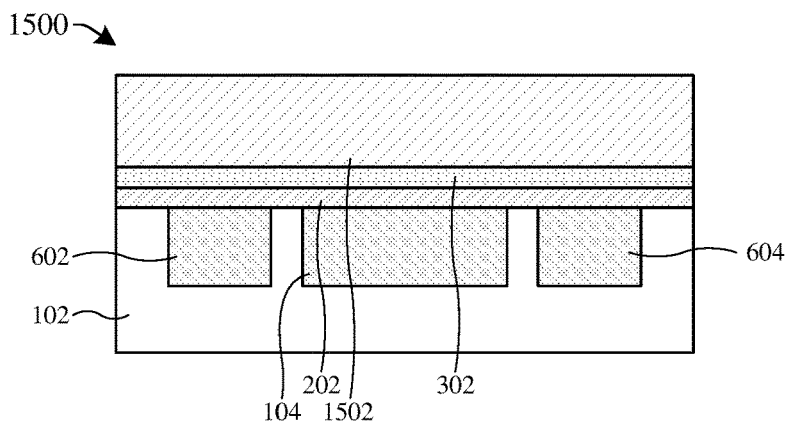

As shown in cross-sectional view 1500 of FIG. 15, a first ferroelectric layer 1502 is formed over the first seed layer 302. In some embodiments, the stress layer 202 is configured to apply the tensile stress on the first ferroelectric layer 1502. In some embodiments, a process for forming the first ferroelectric layer 1502 comprises depositing the first ferroelectric layer 1502 on the first seed layer 302. The first ferroelectric layer 1502 may be deposited by, for example, ALD, PVD, CVD, some other deposition process, or a combination of the foregoing. The first ferroelectric layer 1502 may be or comprise, for example, hafnium zirconium oxide (HfZrO), scandium-doped aluminum nitride (AlScN), some other ferroelectric material, or a combination of the foregoing. In some embodiments, the first ferroelectric layer 1502 is hafnium zirconium oxide (HfZrO). The first ferroelectric layer 1502 may be hafnium zirconium oxide (HfZrO) and comprise oxygen vacancies. In some embodiments, the first ferroelectric layer 1502 is hafnium zirconium oxide (HfZrO) that is doped with aluminum (Al), silicon (Si), lanthanum (La), scandium (Sc), calcium (Ca), barium (Ba), gadolinium (Gd), yttrium (Y), strontium (Sr), or the like. In some embodiments, the first ferroelectric layer 1502 may be formed with a thickness between about 0.1 nm and about 100 nm.

Figure 16:
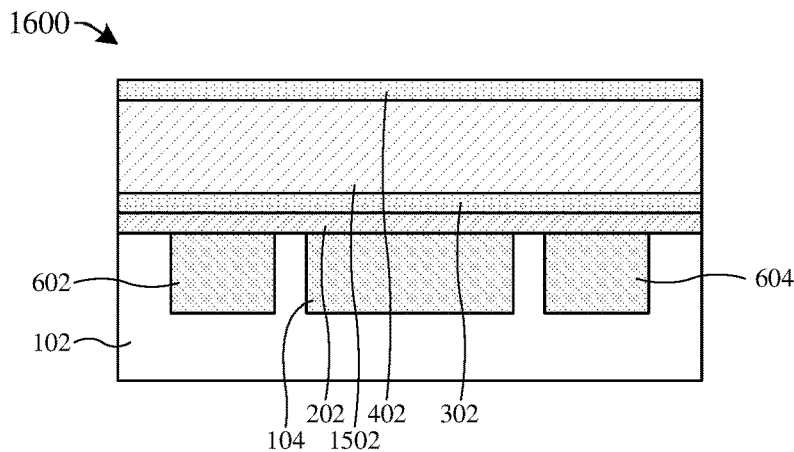

As shown in cross-sectional view 1600 of FIG. 16, a second seed layer 402 is formed over the first ferroelectric layer 1502. In some embodiments, formation of the second seed layer 402 is omitted. The second seed layer may be formed in a substantially similar manner as the first seed layer 302. It will be appreciated that, in some embodiments, the second seed layer 402 is as described in the aforementioned figures.

Figure 17:
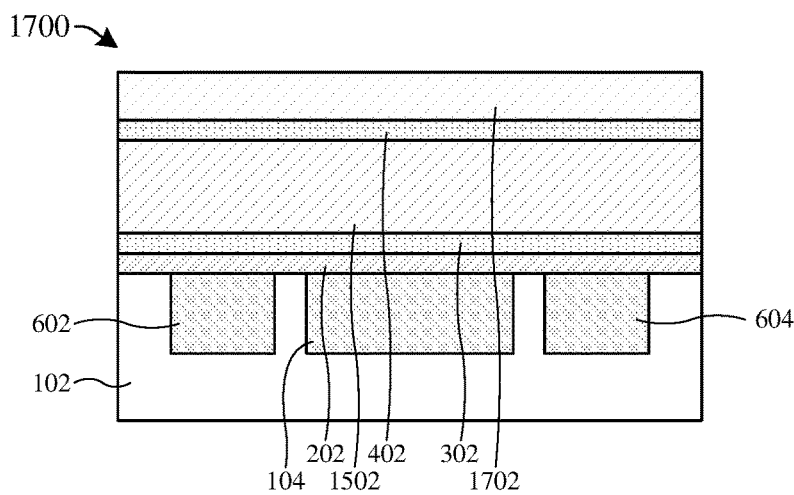

As shown in cross-sectional view 1700 of FIG. 17, a first floating electrode layer 1702 is formed over the second seed layer 402. In some embodiments, a process for forming the first floating electrode layer 1702 comprises depositing the first floating electrode layer 1702 on the second seed layer 402. The first floating electrode layer 1702 may be deposited by, for example, ALD, PVD, CVD, sputtering, electrochemical plating, electroless plating, some other deposition process, or a combination of the foregoing. The first floating electrode layer 1702 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the first floating electrode layer 1702 is formed with a thickness between about 1 nm and about 50 nm.

Figure 18:
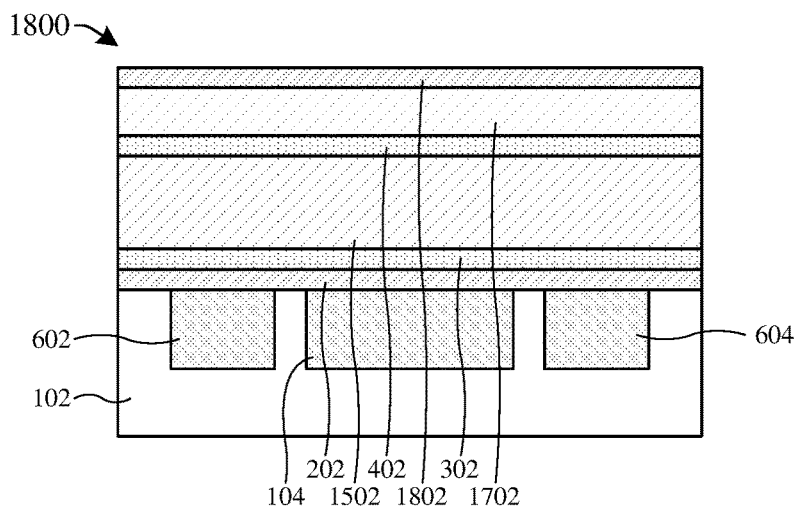

As shown in cross-sectional view 1800 of FIG. 18, a first insulating layer 1802 is formed over the first floating electrode layer 1702. In some embodiments, a process for forming the first insulating layer 1802 comprises depositing or growing the first insulating layer 1802 on the first floating electrode layer 1702. The first insulating layer 1802 may be deposited of grown by, for example, ALD, PVD, CVD, thermal oxidation, some other deposition process, or a combination of the foregoing. The first insulating layer 1802 may be or comprise, for example, hafnium oxide ($HfO_2$), silicon doped hafnium oxide (HSO), hafnium zirconium oxide (HfZrO), silicon oxide ($SiO_2$), aluminum oxide ($Al_2O_3$), yttrium oxide ($Y_2O_3$), zirconium oxide ($ZrO_2$), magnesium oxide (MgO), or the like. In some embodiments, the first insulating layer 1802 is formed with a thickness between about 0.1 nm and about 10 nm. In some embodiments, the first insulating layer 1802 is silicon doped hafnium oxide (HSO) and comprises at least 10% silicon atoms. In some embodiments, the first insulating layer 1802 is a bi-layer structure comprising a silicon doped hafnium oxide (HSO) layer and a hafnium zirconium oxide (HfZrO) layer. In such embodiments, the hafnium zirconium oxide (HfZrO) layer may have a thickness of about 1 nm.

Figure 19:
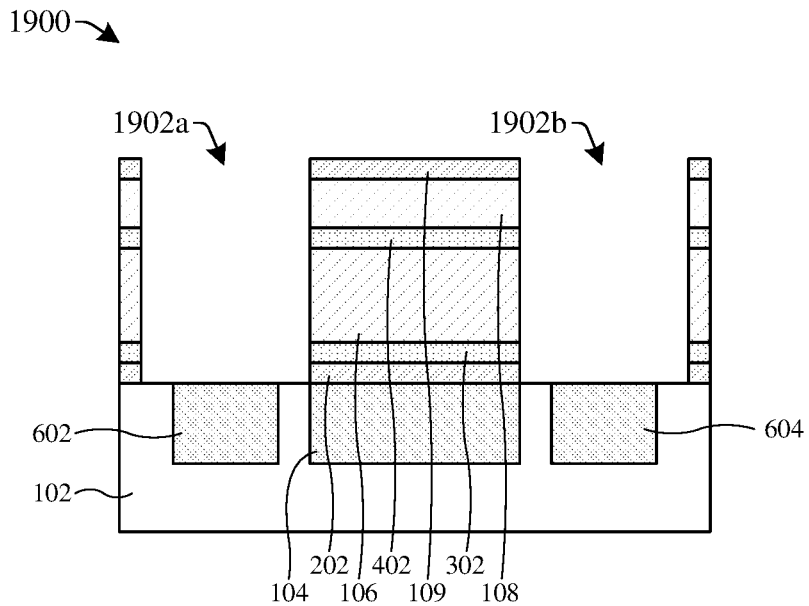

As shown in cross-sectional view 1900 of FIG. 19, a first pair of openings 1902 are formed in the structure illustrated in the cross-sectional view 1800 of FIG. 18. For example, a first opening 1902*a* and a second opening 1902*b* are formed in the structure illustrated in the cross-sectional view 1800 of FIG. 18. The first pair of openings 1902 are formed extending vertically through the first insulating layer 1802, the first floating electrode layer 1702, the first ferroelectric layer 1502, the second seed layer 402, the first seed layer 302, and the stress layer 202. The first opening 1902*a* exposes the first conductive structure 602. The second opening 1902*b* exposes the second conductive structure 604. The first opening 1902*a* is formed on a first side of the lower gate electrode 104. The second opening 1902*b* is formed on a second side of the lower gate electrode 104, which is opposite the first side of the lower gate electrode 104. By forming the first pair of openings 1902, a first ferroelectric structure 106 is formed over the lower gate electrode 104, a first floating electrode structure 108 is formed over the first ferroelectric structure 106, and a first insulating structure 109 is formed over the first floating electrode structure 108. It will be appreciated that, in some embodiments, forming the first pair of openings 1902 also forms the first plurality of remnant structures (see, e.g., FIG. 8).

In some embodiments, a process for forming the first pair of opening 1902 comprises forming a patterned masking layer (not shown) (e.g., positive/negative photoresist, a hardmask, etc.) over the first insulating layer 1802 (see, FIG. 18). The patterned masking layer may be formed by forming a masking layer (not shown) on the first insulating layer 1802 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the first insulating layer 1802, the first floating electrode layer 1702 (see, FIG. 17), the second seed layer 402, the first ferroelectric layer 1502 (see, FIG. 15), the first seed layer 302, and the stress layer 202 according to the patterned masking layer.

The etching process removes unmasked portions of the first insulating layer 1802, thereby forming the first insulating structure 109 between the first opening 1902*a* and the second opening 1902*b*. The etching process also removes unmasked portions of the first floating electrode layer 1702, thereby forming the first floating electrode structure 108 between the first opening 1902*a* and the second opening 1902*b*. The etching process also removes unmasked portions of the first ferroelectric layer 1502, thereby forming the first ferroelectric structure 106 between the first opening 1902a and the second opening 1902b. The etching process also removes unmasked portions of the second seed layer 402, the first seed layer 302, and the stress layer 202. By removing the unmasked portions of the first insulating layer 1802, the first floating electrode layer 1702, the first ferroelectric layer 1502, the second seed layer 402, the first seed layer 302, and the stress layer 202, the first pair of openings 1902 are formed. In some embodiments, the etching process may be or comprise, for example, a wet etching process, a dry etching process, a reactive ion etching (RIE) process, some other etching process, or a combination of the foregoing. Subsequently, the patterned masking layer is stripped away. It will be appreciated that, in some embodiments, the first ferroelectric structure 106, the first floating electrode structure 108, and the first insulating structure 109 are as described in the aforementioned figures.

Figure 20:
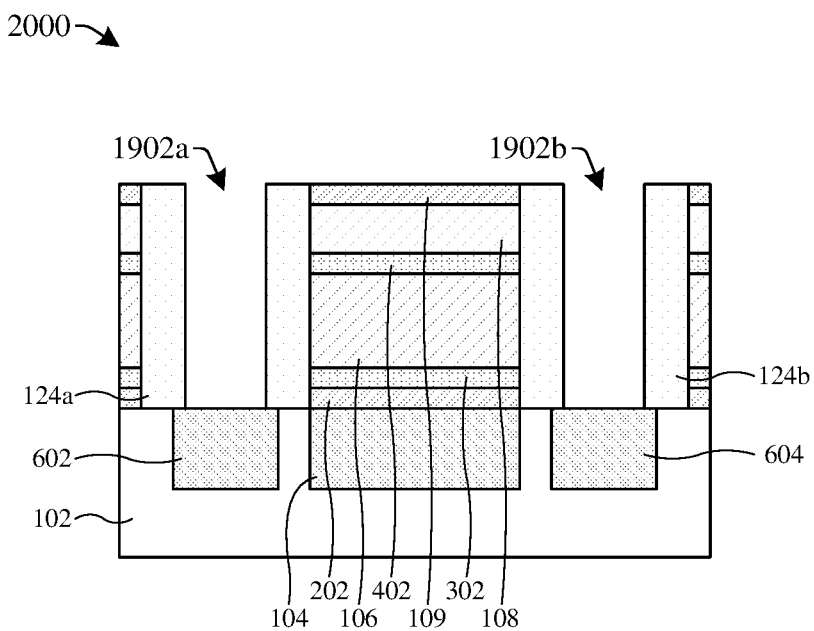

As shown in cross-sectional view 2000 of FIG. 20, a first plurality of spacer structures 124 are formed in the first pair of openings 1902. For example, a first spacer structure 124a is formed in the first opening 1902a and over the first dielectric layer 102, and a second spacer structure 124b is formed in the second opening 1902b and over the first dielectric layer 102. The first plurality of spacer structures 124 are formed lining sidewalls of the first pair of openings 1902. In some embodiments, a process for forming the first plurality of spacer structures 124 comprises depositing a spacer layer (not shown) over the first insulating structure 109 and in (e.g., along the sidewalls) of the first pair of openings 1902. The spacer layer may be deposited by, for example, CVD, PVD, ALD, some other deposition process, or a combination of the foregoing. Thereafter, horizontal portions of the spacer layer are etched away (e.g., via an anisotropic etching process), thereby leaving vertical portions of the spacer layer in place as the first plurality of spacer structures 124. In some embodiments, the spacer layer may be or comprise, for example, an oxide (e.g., $SiO_2$), a nitride (e.g., SiN), an oxy-nitride (e.g., SiON), some other dielectric material, or a combination of the foregoing. It will be appreciated that, in some embodiments, the first plurality of spacer structures 124 are as described in the aforementioned figures.

Figure 21:
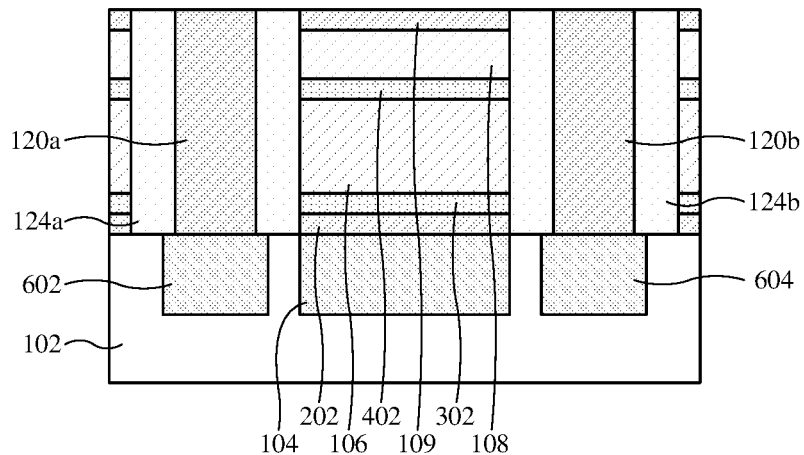

As shown in cross-sectional view 2100 of FIG. 21, a first pair of S/D structures 120 are formed in the first pair of openings 1902 (see, FIG. 20) and between inner sidewalls of the first plurality of spacer structures 124. For example, a first S/D structure 120a is formed in the first opening 1902a and between inner sidewalls of the first spacer structure 124a, and a second S/D structure 120b is formed in the second opening 1902b and between inner sidewalls of the second spacer structure 124b. The first S/D structure 120a is formed electrically coupled to the first conductive structure 602. The second S/D structure 120b is formed electrically coupled to the second conductive structure 604. In some embodiments, the first pair of S/D structures 120 may be formed with a thickness between about 50 nm and about 1000 nm. For example, the first S/D structure 120a may be formed with a thickness between about 50 nm and about 1000 nm.

In some embodiments, a process for forming the first pair of S/D structures 120 comprises depositing a conductive layer (not shown) over the first insulating structure 109 and in the first pair of openings 1902 (e.g., the remaining portions of the first pair of openings 1902 not occupied by the first plurality of spacer structures 124). The conductive layer may be deposited by, for example, ALD, PVD, CVD, sputtering, electrochemical plating, electroless plating, some other deposition process, or a combination of the foregoing. Thereafter, a planarization process (e.g., a chemical mechanical polishing (CMP) process, an etch back process, etc.) is performed on the conductive layer, thereby forming the first pair of S/D structures 120. The conductive layer may be or comprise, for example, titanium (Ti), titanium nitride (TiN), tungsten (W), tungsten nitride (WN), tantalum (Ta), tantalum nitride (TaN), platinum (Pt), gold (Au), or the like. It will be appreciated that, in some embodiments, the first pair of S/D structures 120 are as described in the aforementioned figures.

Figure 22:
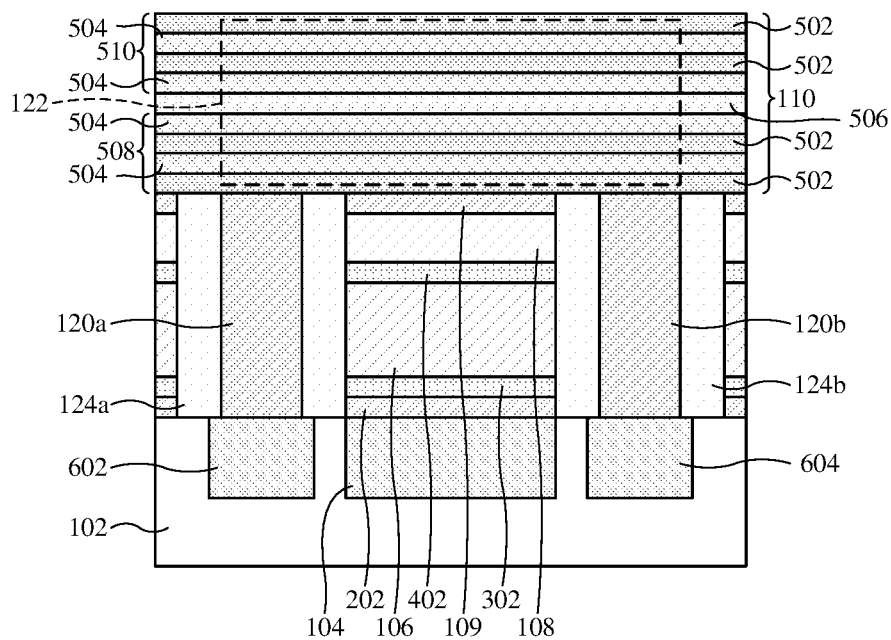

As shown in cross-sectional view 2200 of FIG. 22, a channel structure 110 is formed over the first insulating structure 109, the first plurality of spacer structures 124, and the first pair of S/D structures 120. A selectively-conductive channel 122 is disposed in the channel structure 110. In some embodiments, the channel structure 110 comprises a plurality of first channel layers 502, a plurality of second channel layers 504, and a third channel layer 506. More specifically, the channel structure 110 may comprise a first stack 508 of first and second channel layers and a second stack 510 of first and second channel layers. The first stack 508 of first and second channel layers comprises a first set of the first channel layers 502 and a first set of the second channel layers 504, which are stacked vertically in alternating order. The second stack 510 of first and second channel layers comprises a second set of the first channel layers 502 and a second set of the second channel layers 504, which are stacked vertically in alternating order. The third channel layer 506 is disposed vertically between the first stack 508 of first and second channel layers and the second stack 510 of first and second channel layers.

The first channel layers 502 comprise a mixture of a first material and a second material. The second channel layers 504 comprise a third material different than the first and second materials. The third channel layer 506 comprises a mixture of the first, second, and third materials. In some embodiments, the first material comprises gallium oxide (GaO), hafnium oxide (HfO), zirconium oxide (ZrO), titanium oxide (TiO), aluminum oxide (AlO), tantalum oxide (TaO), strontium oxide (SrO), barium oxide (BaO), scandium oxide (ScO), magnesium oxide (MgO), lanthanum oxide (LaO), gadolinium oxide (GdO), or the like. In some embodiments, the second material comprises indium oxide (InO), tin oxide (SnO), arsenic oxide (AsO), zinc oxide (ZnO), or the like. In some embodiments, the third material comprises zinc oxide (ZnO). Thus, for example, in some embodiments, the first material comprises gallium oxide (GaO); the second material comprises indium oxide (InO); and the third material comprises zinc oxide (ZnO), such that the first channel layers 502 comprise a mixture of gallium oxide (GaO) and indium oxide (InO), the second channel layers 504 comprise zinc oxide (ZnO), and the third channel layer 506 is indium gallium zinc oxide (IGZO). In further embodiments, the third channel layer 506 is amorphous indium gallium zinc oxide (a-IGZO).

In some embodiments, a process for forming the channel structure 110 comprises depositing the plurality of first channel layers 502, the plurality of second channel layers 504, and the third channel layer 506 over the first insulating structure 109, the first plurality of spacer structures 124, and the first pair of S/D structures 120. The plurality of first channel layers 502, the plurality of second channel layers 504, and the third channel layer 506 may be deposited by, for example, ALD, CVD, PVD, some other deposition process, or a combination of the foregoing.

In some embodiments, the plurality of first channel layers 502, the plurality of second channel layers 504, and the third channel layer 506 are deposited in a processing chamber by using solid precursors. In some embodiments, to form each of the plurality of first channel layers 502, a first solid precursor (e.g., an solid indium precursor) and a second solid precursor (e.g., a solid gallium precursor) are activated at the same time (e.g., co-pulsed). An inert gas is used to activate the first and second solid precursors and to generate a first precursor vapor that flows into the processing chamber, thereby forming a first processing layer (e.g., an indium-gallium layer) on the workpiece (e.g., the structure illustrated in FIG. 21). Thereafter, an oxygen vapor is introduced into the processing chamber that reacts with the first processing layer, thereby forming one of the first channel layers 502 (e.g., an indium oxide/gallium oxide layer)

In some embodiments, to form each of the plurality of second channel layers 504, a third solid precursor (e.g., a solid zinc precursor) is activated (e.g., pulsed). An inert gas is used to activate the third solid precursor and to generate a second precursor vapor that flows into the processing chamber, thereby forming a second processing layer (e.g., a zinc layer) on the workpiece (e.g., the structure illustrated in FIG. 21 plus a first one of the first channel layers 502). Thereafter, an oxygen vapor is introduced into the processing chamber that reacts with the second processing layer, thereby forming one of the second channel layers 504 (e.g., a zinc oxide layer).

In some embodiments, to form the third channel layer 506, the first solid precursor, the second solid precursor, and the third solid precursor are activated at the same time (e.g., tri-pulsed). An inert gas is used to activate the first, second, and third solid precursors and to generate a third precursor vapor that flows into the processing chamber, thereby forming a third processing layer (e.g., an indium-gallium-zinc layer) on the workpiece (e.g., the structure illustrated in FIG. 21 plus the first stack 508 of first and second channel layers). Thereafter, an oxygen vapor is introduced into the processing chamber that reacts with the third processing layer, thereby forming the third channel layer 506 (e.g., a-IGZO layer). The above steps are repeated in a predefined manner, thereby forming the third channel layer 506, the first stack 508 of first and second channel layers, and the second stack 510 of first and second channel layers, as shown in the cross-sectional view 2200 of FIG. 22. It will be appreciated that, in some embodiments, the channel structure 110, the selectively-conductive channel 122, the plurality of first channel layers 502, plurality of second channel layers 504, the third channel layer 506, the first stack 508 of first and second channel layers, and the second stack 510 of first and second channel layers are as described in the aforementioned figures.

Figure 23:
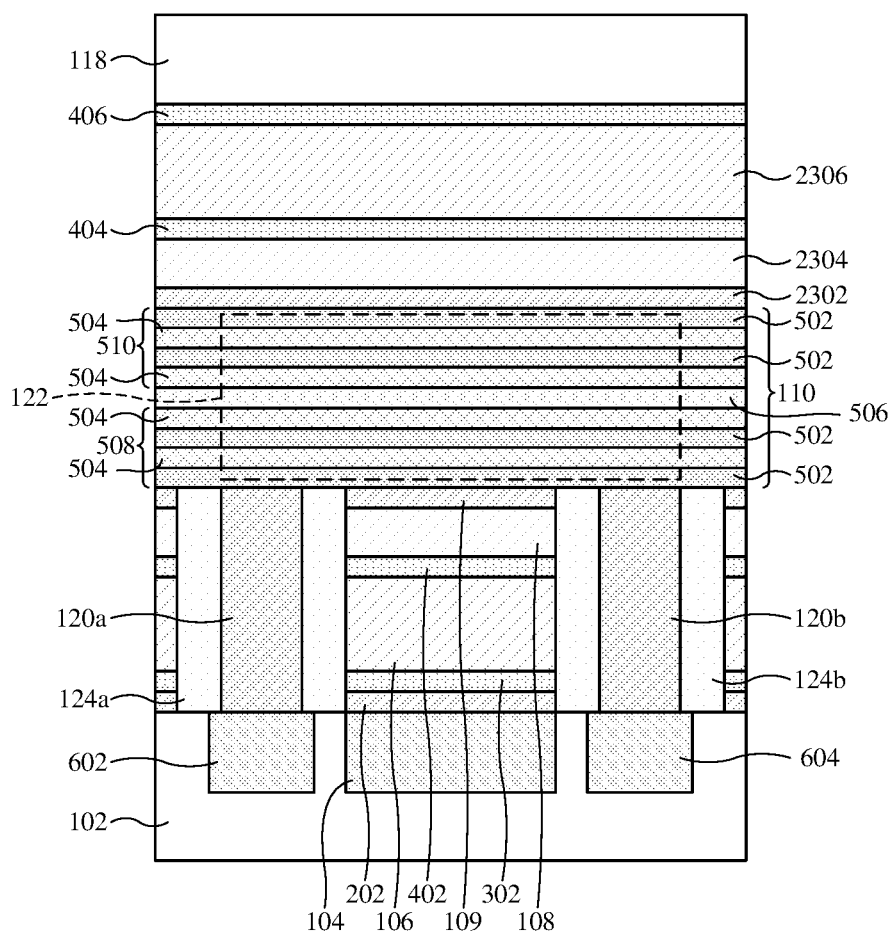

As shown in cross-sectional view 2300 of FIG. 23, a second insulating layer 2302 is formed over the channel structure 110. The second insulating layer 2302 may be or comprise, for example, hafnium oxide ($HfO_2$), silicon doped hafnium oxide (HSO), hafnium zirconium oxide (HfZrO), silicon oxide ($SiO_2$), aluminum oxide ($Al_2O_3$), yttrium oxide ($Y_2O_3$), zirconium oxide ($ZrO_2$), magnesium oxide (MgO), or the like. In some embodiments, the second insulating layer 2302 is formed with a thickness between about 0.1 nm and about 10 nm. In some embodiments, the second insulating layer 2302 is silicon doped hafnium oxide (HSO) and comprises at least 10% silicon atoms. In some embodiments, the second insulating layer 2302 is a bi-layer structure comprising a silicon doped hafnium oxide (HSO) layer and a hafnium zirconium oxide (HfZrO) layer. In such embodiments, the hafnium zirconium oxide (HfZrO) layer may have a thickness of about 1 nm. In some embodiments, a process for forming the second insulating layer 2302 comprises depositing the second insulating layer 2302 on the channel structure 110. The second insulating layer 2302 may be deposited of grown by, for example, ALD, PVD, CVD, thermal oxidation, some other deposition process, or a combination of the foregoing.

Also shown in the cross-sectional view 2300 of FIG. 23, a second floating electrode layer 2304 is formed over the second insulating layer 2302. In some embodiments, a process for forming the second floating electrode layer 2304 comprises depositing the second floating electrode layer 2304 on the second insulating layer 2302. The second floating electrode layer 2304 may be deposited by, for example, ALD, PVD, CVD, sputtering, electrochemical plating, electroless plating, some other deposition process, or a combination of the foregoing. The second floating electrode layer 2304 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the second floating electrode layer 2304 is formed with a thickness between about 1 nm and about 50 nm.

Also shown in the cross-sectional view 2300 of FIG. 23, a third seed layer 404 is formed over the second floating electrode layer 2304. In some embodiments, formation of the third seed layer 404 is omitted. The third seed layer 404 may be formed in a substantially similar manner as the first seed layer 302. It will be appreciated that, in some embodiments, the third seed layer 404 is as described in the aforementioned figures.

Also shown in the cross-sectional view 2300 of FIG. 23, a second ferroelectric layer 2306 is formed over the third seed layer 404. In some embodiments, a process for forming the second ferroelectric layer 2306 comprises depositing the second ferroelectric layer 2306 on the third seed layer 404. The second ferroelectric layer 2306 may be deposited by, for example, ALD, PVD, CVD, some other deposition process, or a combination of the foregoing. The second ferroelectric layer 2306 may be or comprise, for example, hafnium zirconium oxide (HfZrO), scandium-doped aluminum nitride (AlScN), some other ferroelectric material, or a combination of the foregoing. In some embodiments, the second ferroelectric layer 2306 is hafnium zirconium oxide (HfZrO). The second ferroelectric layer 2306 may be hafnium zirconium oxide (HfZrO) and comprise oxygen vacancies. In some embodiments, the second ferroelectric layer 2306 is hafnium zirconium oxide (HfZrO) that is doped with aluminum (Al), silicon (Si), lanthanum (La), scandium (Sc), calcium (Ca), barium (Ba), gadolinium (Gd), yttrium (Y), strontium (Sr), or the like. In some embodiments, the second ferroelectric layer 2306 may be formed with a thickness between about 0.1 nm and about 100 nm.

Also shown in the cross-sectional view 2300 of FIG. 23, a fourth seed layer 406 is formed over the second ferroelectric layer 2306. In some embodiments, formation of the fourth seed layer 406 is omitted. The fourth seed layer 406 may be formed in a substantially similar manner as the first seed layer 302. It will be appreciated that, in some embodiments, the fourth seed layer 406 is as described in the aforementioned figures.

Also shown in the cross-sectional view 2300 of FIG. 23, a second dielectric layer 118 is formed over the fourth seed layer 406. In some embodiments, a process for forming the second dielectric layer 118 comprises depositing the second dielectric layer 118 on the fourth seed layer 406. The second dielectric layer 118 may be deposited by, for example, CVD, PVD, ALD, a spin-on process, some other deposition process, or a combination of the foregoing.

As shown in cross-sectional view 2400, a second pair of openings 2402 are formed in the structure illustrated in the cross-sectional view 2300 of FIG. 23. For example, a third opening 2402a and a fourth opening 2402b are formed in the structure illustrated in the cross-sectional view 2300 of FIG. 23. The second pair of openings 2402 are formed over the channel structure 110. The second pair of openings 2402 are formed extending vertically through the second insulating layer 2302, the second floating electrode layer 2304, the second ferroelectric layer 2306, the third seed layer 404, the fourth seed layer 406, and the second dielectric layer 118. The third opening 2402a exposes a first portion of the channel structure 110. The fourth opening 2402b exposes a second portion of the channel structure 110. By forming the second pair of openings 2402, a second insulating structure 111 is formed over the channel structure 110, a second floating electrode structure 112 is formed over the second insulating structure 111, and a second ferroelectric structure 114 is formed over the second floating electrode structure 112. It will be appreciated that, in some embodiments, forming the second pair of openings 2402 also forms the second plurality of remnant structures (see, e.g., FIG. 8).

In some embodiments, a process for forming the second pair of opening 2402 comprises forming a patterned masking layer (not shown) (e.g., positive/negative photoresist, a hardmask, etc.) over the second dielectric layer 118. The patterned masking layer may be formed by forming a masking layer (not shown) on second dielectric layer 118 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the second dielectric layer 118, the fourth seed layer 406, the second ferroelectric layer 2306, the third seed layer 404, the second floating electrode layer 2304, and the second insulating layer 2302 (see, FIG. 23) according to the patterned masking layer.

The etching process removes unmasked portions of the second insulating layer 2302, thereby forming the second insulating structure 111 between the third opening 2402a and the fourth opening 2402b. The etching process also removes unmasked portions of the second floating electrode layer 2304, thereby forming the second floating electrode structure 112 between the third opening 2402a and the fourth opening 2402b. The etching process also removes unmasked portions of the second ferroelectric layer 2306, thereby forming the second ferroelectric structure 114 between the third opening 2402a and the fourth opening 2402b. The etching process also removes unmasked portions of the third seed layer 404, the fourth seed layer 406, and the second dielectric layer 118. By removing the unmasked portions of the second insulating layer 2302, the second floating electrode layer 2304, the second ferroelectric layer 2306, the third seed layer 404, the fourth seed layer 406, and the second dielectric layer 118, the second pair of openings 2402 are formed. In some embodiments, the etching process may be or comprise, for example, a wet etching process, a dry etching process, a RIE process, some other etching process, or a combination of the foregoing. Subsequently, the patterned masking layer is stripped away. It will be appreciated that, in some embodiments, the second ferroelectric structure 114, the second floating electrode structure 112, and the second insulating structure 111 are as described in the aforementioned figures.

Figure 25:
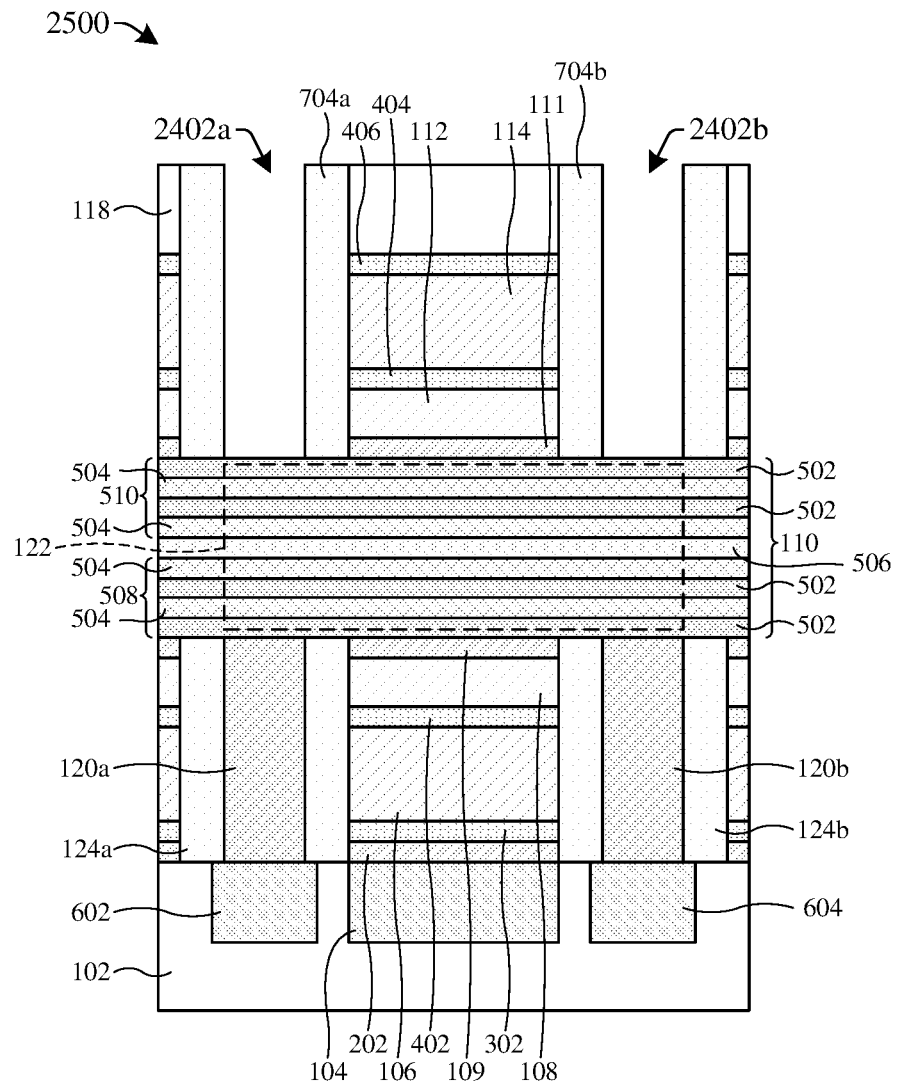

As shown in cross-sectional view 2500 of FIG. 25, a second plurality of spacer structures 704 are formed in the second pair of openings 2402. For example, a third spacer structure 704a is formed in the third opening 2402a and over the channel structure 110, and a fourth spacer structure 704b is formed in the fourth opening 2402b and over the channel structure 110. The second plurality of spacer structures 704 are formed lining sidewalls of the second pair of openings 2402. In some embodiments, a process for forming the second plurality of spacer structure 704 comprises depositing a spacer layer (not shown) over the second dielectric layer 118 and in (e.g., along the sidewalls) of the second pair of openings 2402. The spacer layer may be deposited by, for example, CVD, PVD, ALD, some other deposition process, or a combination of the foregoing. Thereafter, horizontal portions of the spacer layer are etched away (e.g., via an anisotropic etching process), thereby leaving vertical portions of the spacer layer in place as the second plurality of spacer structures 704. In some embodiments, the spacer layer may be or comprise, for example, an oxide (e.g., $SiO_2$), a nitride (e.g., SiN), an oxy-nitride (e.g., SiON), some other dielectric material, or a combination of the foregoing. It will be appreciated that, in some embodiments, the second plurality of spacer structures 704 are as described in the aforementioned figures.

Figure 26:
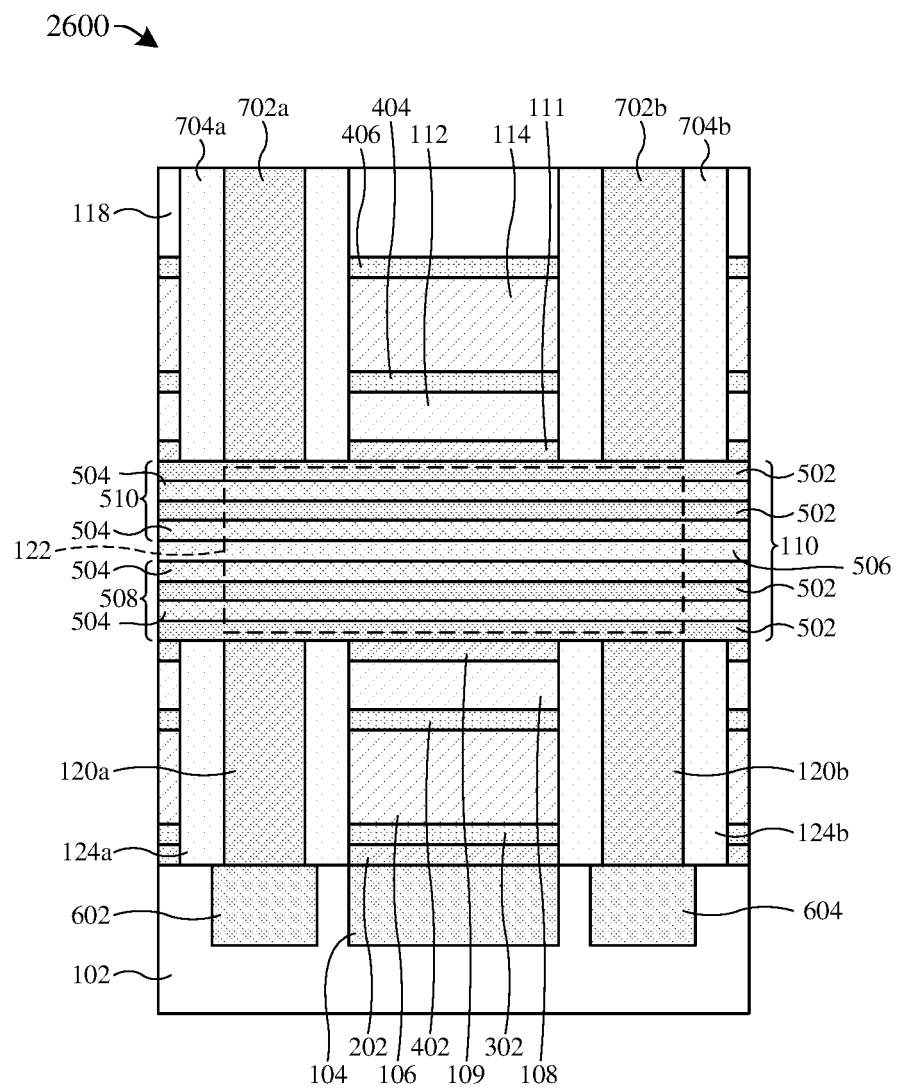

As shown in cross-sectional view 2600 of FIG. 26, a second pair of S/D structures 702 are formed in the second pair of openings 2402 (see, FIG. 25) and between inner sidewalls of the second plurality of spacer structures 704. For example, a third S/D structure 702a is formed in the third opening 2402a and between inner sidewalls of the third spacer structure 704a, and a fourth S/D structure 702b is formed in the fourth opening 2402b and between inner sidewalls of the fourth spacer structure 704b. In some embodiments, the second pair of S/D structures 702 may be formed with a thickness between about 50 nm and about 1000 nm. For example, the third S/D structure 702a may be formed with a thickness between about 50 nm and about 1000 nm.

In some embodiments, a process for forming the second pair of S/D structures 702 comprises depositing a conductive layer (not shown) over the second dielectric layer 118 and in the second pair of openings 2402 (e.g., the remaining portions of the second pair of openings 2402 not occupied by the second plurality of spacer structures 704). The conductive layer may be deposited by, for example, ALD, PVD, CVD, sputtering, electrochemical plating, electroless plating, some other deposition process, or a combination of the foregoing. Thereafter, a planarization process (e.g., a CMP process, an etch back process, etc.) is performed on the conductive layer, thereby forming the second pair of S/D structures 702. The conductive layer may be or comprise, for example, titanium (Ti), titanium nitride (TiN), tungsten (W), tungsten nitride (WN), tantalum (Ta), tantalum nitride (TaN), platinum (Pt), gold (Au), or the like. It will be appreciated that, in some embodiments, the second pair of S/D structures 702 are as described in the aforementioned figures.

Figure 27:
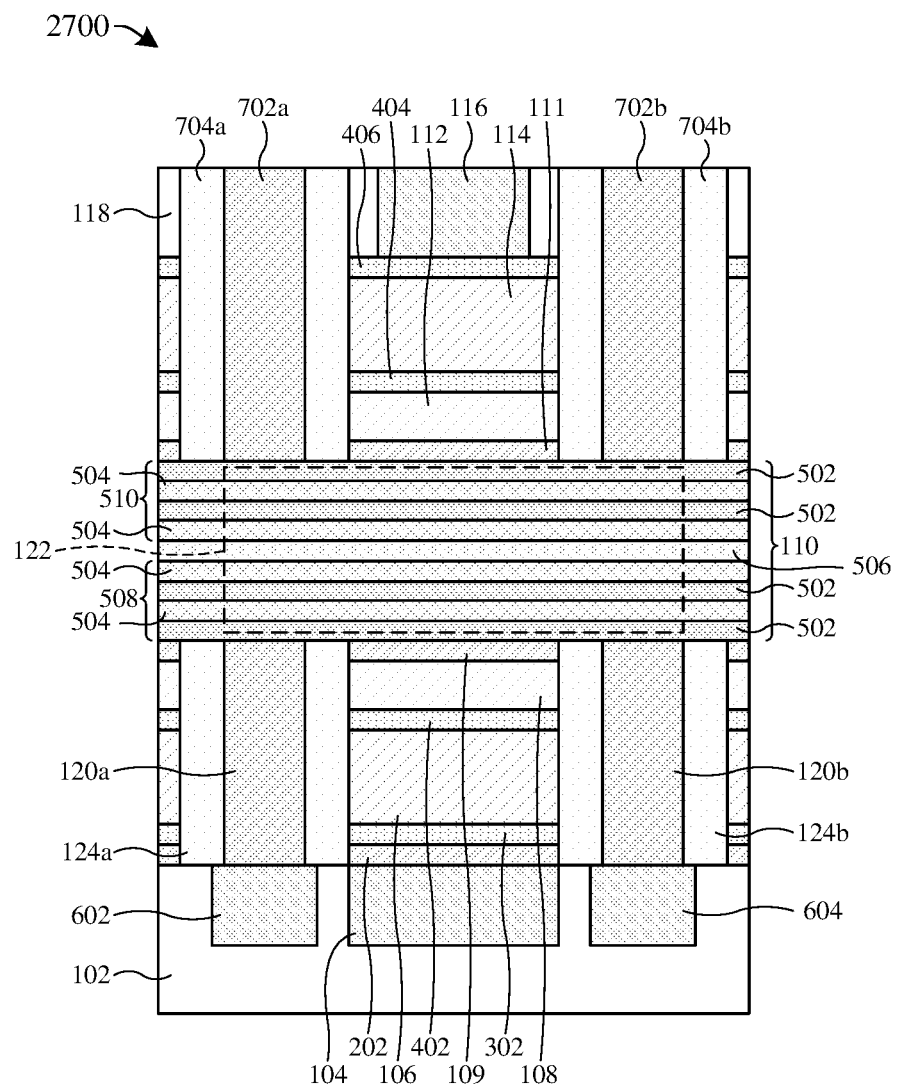

As shown in cross-sectional view 2700 of FIG. 27, an upper gate electrode 116 is formed in the second dielectric layer 118 and over the second ferroelectric structure 114. In some embodiments, a process for forming the upper gate electrode 116 comprises forming a patterned masking layer (not shown) (e.g., positive/negative photoresist, a hardmask, etc.) over the second dielectric layer 118, the second plurality of spacer structures 704, and the second pair of S/D structures 702. The patterned masking layer may be formed by forming a masking layer (not shown) on second dielectric layer 118, the second plurality of spacer structures 704, and the second pair of S/D structures 702; exposing the masking layer to a pattern (e.g., via a lithography process, such as photolithography, extreme ultraviolet lithography, or the like); and developing the masking layer to form the patterned masking layer. Thereafter, with the patterned masking layer in place, an etching process is performed on the second dielectric layer 118, thereby forming an opening in the second dielectric layer 118 and laterally between the third S/D structure 702a and the fourth S/D structure 702b.

Thereafter, a conductive layer is deposited in the opening and over the patterned masking layer. The conductive layer may be deposited by, for example, ALD, PVD, CVD, sputtering, electrochemical plating, electroless plating, some other deposition process, or a combination of the foregoing. Thereafter, a planarization process (e.g., a CMP process, an etch back process, etc.) is performed on the conductive layer and the patterned masking layer, thereby forming the upper gate electrode 116 and removing the patterned masking layer. The conductive layer may be or comprise, for example, platinum (Pt), titanium (Ti), titanium nitride (TiN), tantalum (Ta), tantalum nitride (TaN), tungsten (W), tungsten nitride (WN), gold (Au), iron (Fe), nickel (Ni), beryllium (Be), chromium (Cr), cobalt (Co), antimony (Sb), iridium (Jr), molybendum (Mo), osmium (Os), thorium (Th), vanadium (V), some other metal or metal nitride, or a combination of the foregoing. It will be appreciated that, in some embodiments, the upper gate electrode 116 is as described in the aforementioned figures.

Figure 28:
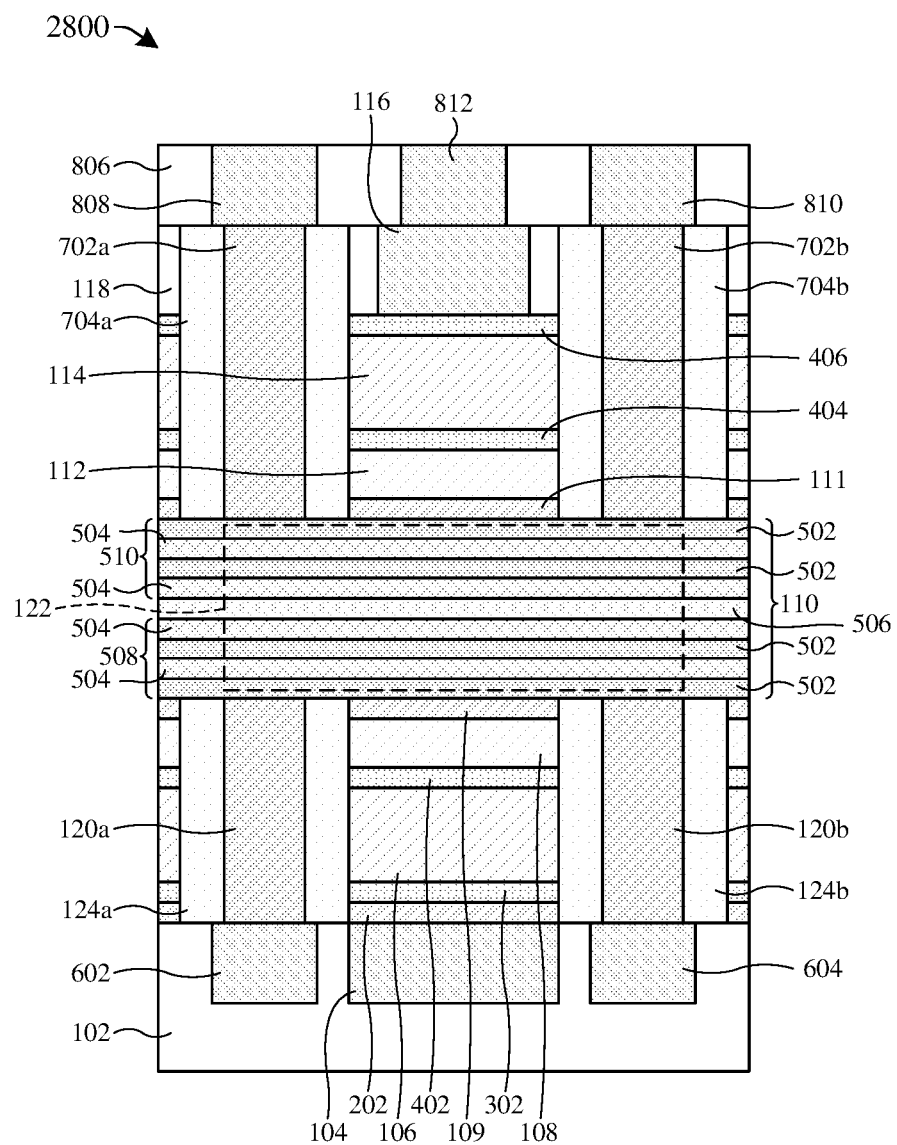

As shown in the cross-sectional view 2800 of FIG. 28, a fifth dielectric layer 806 is formed over the upper gate electrode 116, the second dielectric layer 118, the second plurality of spacer structures 704, and the second pair of S/D structures 702. In some embodiments, a process for forming the fifth dielectric layer 806 comprises depositing the fifth dielectric layer 806 on the upper gate electrode 116, the second dielectric layer 118, the second plurality of spacer structures 704, and the second pair of S/D structures 702. The fifth dielectric layer 806 may be deposited by, for example, CVD, PVD, ALD, a spin-on process, some other deposition process, or a combination of the foregoing.

Also shown in the cross-sectional view 2800 of FIG. 28, a third conductive structure 808, a fourth conductive structure 810, and a fifth conductive structure 812 are formed in the fifth dielectric layer 806. The third conductive structure 808 is formed electrically coupled to the third S/D structure 702a. The fourth conductive structure 810 is formed electrically coupled to the fourth S/D structure 702b. The fifth conductive structure 812 is formed electrically coupled to the upper gate electrode 116.

In some embodiments, a process for forming the third conductive structure 808, the fourth conductive structure 810, and the fifth conductive structure 812 comprises: forming a plurality of openings in the fifth dielectric layer 806 (e.g., via a photolithography/etching process); depositing a conductive layer in the plurality of openings and over an upper surface of the fifth dielectric layer 806; and planarizing the conductive layer to localize the conductive layer to the plurality of openings. Other suitable processes are, however, amenable. The conductive layer may be deposited by, for example, CVD, PVD, ALD, sputtering, electrochemical plating, electroless plating, some other deposition process, or a combination of the foregoing. It will be appreciated that, in some embodiments, the fifth dielectric layer 806, the third conductive structure 808, the fourth conductive structure 810, and the fifth conductive structure 812 are as described in the aforementioned figures. Although not shown, it will also be appreciated that additional conductive structure (e.g., metal wires, metal vias, bond pads, etc.) may be formed over and electrically coupled to the third conductive structure 808, the fourth conductive structure 810, and the fifth conductive structure 812.

Figure 29:
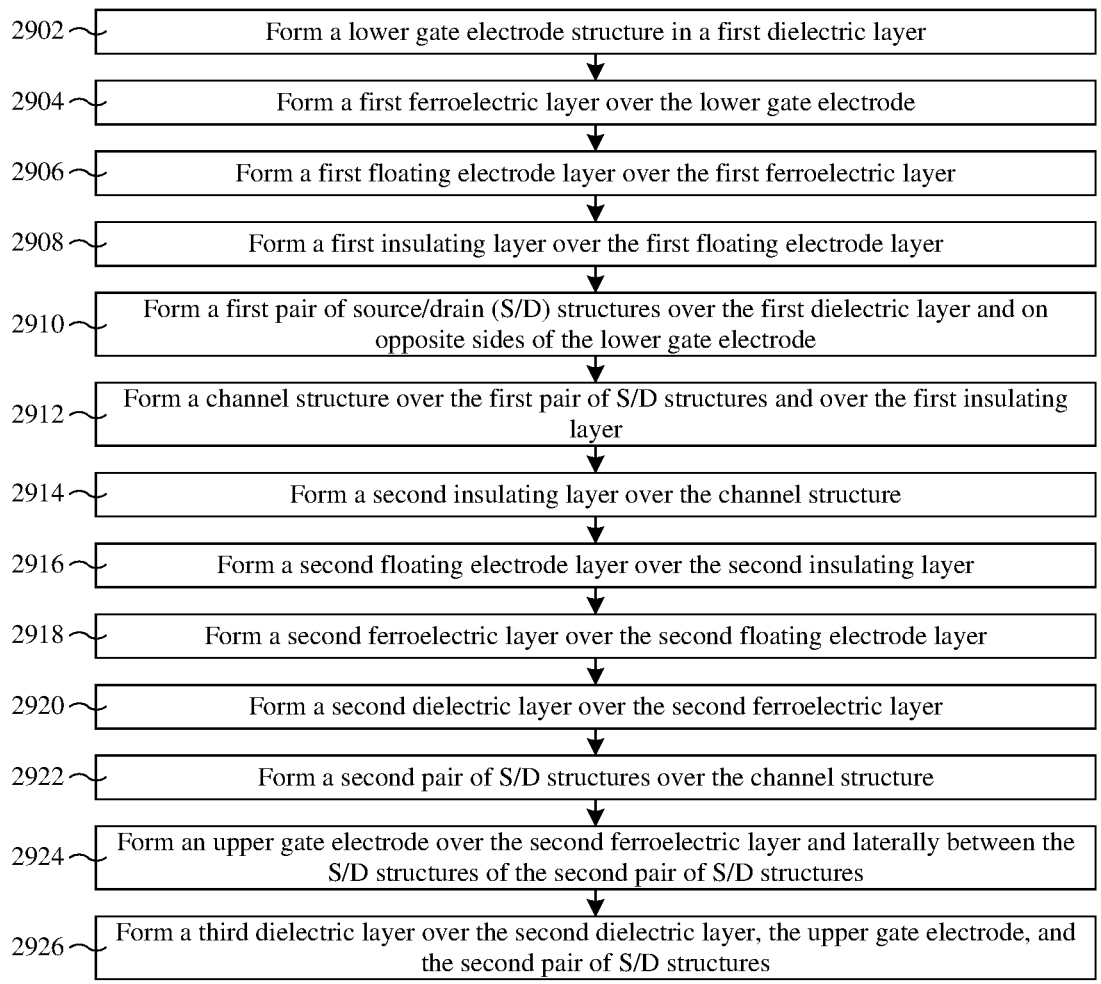
FIG. 29 illustrates a flowchart of some embodiments of a method for forming an integrated chip (IC) comprising a double gate metal-ferroelectric-metal-insulator-semiconductor field-effect transistor (MFMIS-FET) structure.

FIG. 29 illustrates a flowchart 2900 of some embodiments of a method for forming an integrated chip (IC) comprising a double gate metal-ferroelectric-metal-insulator-semiconductor field-effect transistor (MFMIS-FET) structure. While the flowchart 2900 of FIG. 29 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2902, a lower gate electrode is formed in a first dielectric layer. FIG. 12 illustrates a cross-sectional view 1200 of some embodiments corresponding to act 2902.

At act 2904, a first ferroelectric layer is formed over the lower gate electrode. FIGS. 13-15 illustrate a series of cross-sectional views 1300-1500 of some embodiments corresponding to act 2904.

At act 2906, a first floating electrode layer is formed over the first ferroelectric layer. FIGS. 16-17 illustrate a series of cross-sectional views 1600-1700 of some embodiments corresponding to act 2906.

At act 2908, a first insulating layer is formed over the first floating electrode layer. FIG. 18 illustrates a cross-sectional view 1800 of some embodiments corresponding to act 2908.

At act 2910, a first pair of source/drain (S/D) structures are formed over the first dielectric layer and on opposite sides of the lower gate electrode. FIGS. 19-21 illustrate a series of cross-sectional views 1900-2100 of some embodiments corresponding to act 2910.

At act 2912, a channel structure is formed over the first pair of S/D structures and over the first insulating layer. FIG. 22 illustrates a cross-sectional view 2200 of some embodiments corresponding to act 2912.

At act 2914, a second insulating layer is formed over the channel structure. FIG. 23 illustrates a cross-sectional view 2300 of some embodiments corresponding to act 2914.

At act 2916, a second floating electrode layer is formed over the second insulating layer. FIG. 23 illustrates a cross-sectional view 2300 of some embodiments corresponding to act 2916.

At act 2918, a second ferroelectric layer is formed over the second floating electrode layer. FIG. 23 illustrates a cross-sectional view 2300 of some embodiments corresponding to act 2918.

At act 2920, a second dielectric layer is formed over the second ferroelectric layer. FIG. 23 illustrates a cross-sectional view 2300 of some embodiments corresponding to act 2920.

Figure 24:
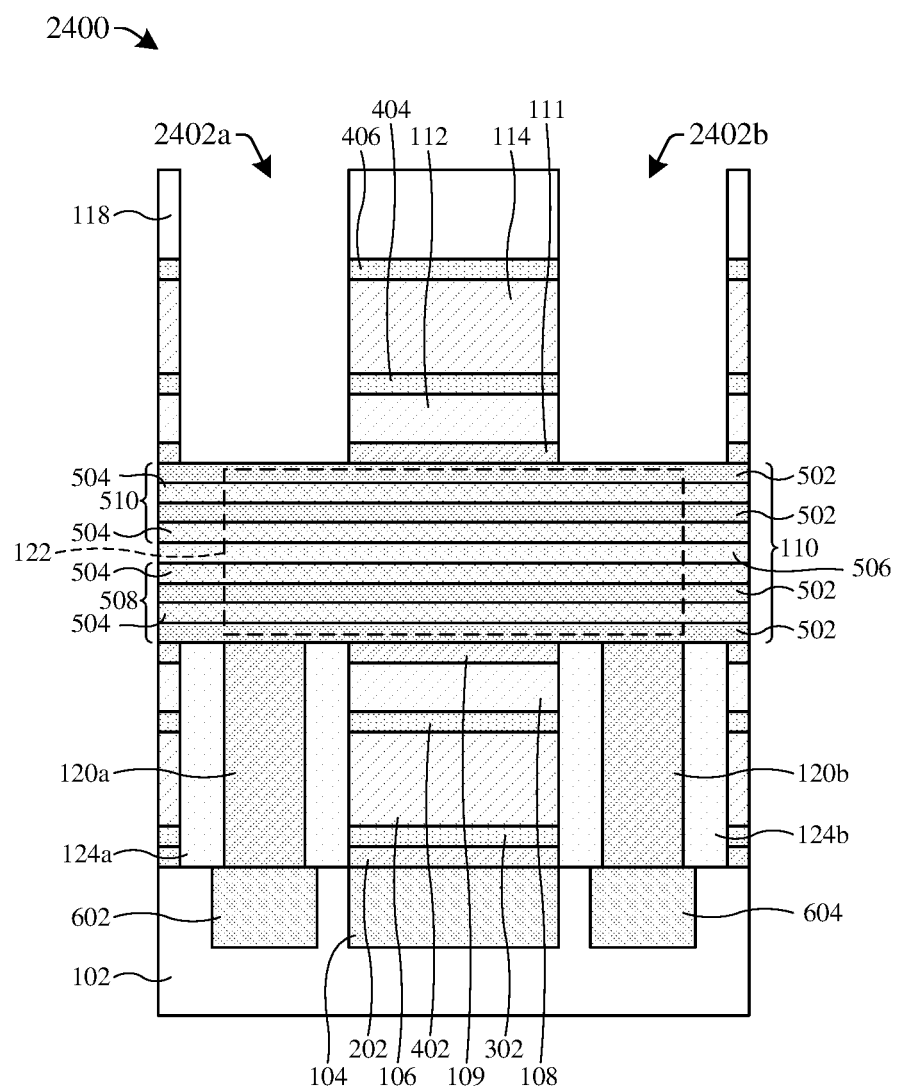

At act 2922, a second pair of S/D structures are formed over the channel structure. FIGS. 24-26 illustrate a series of cross-sectional views 2400-2600 of some embodiments corresponding to act 2922.

At act 2924, an upper gate electrode is formed over the second ferroelectric layer and laterally between the S/D structures of the second pair of S/D structures. FIG. 27 illustrates a cross-sectional view 2700 of some embodiments corresponding to act 2924.

At act 2926, a third dielectric layer is formed over the second dielectric layer, the upper gate electrode, and the second pair of S/D structures. FIG. 28 illustrates a cross-sectional view 2800 of some embodiments corresponding to act 2926.

In some embodiments, the present application provides an integrated chip (IC). The IC comprises a lower gate electrode disposed in a dielectric structure. A first ferroelectric structure overlies the lower gate electrode. A first floating electrode structure overlies the first ferroelectric structure. A channel structure overlies the first floating electrode structure. A second floating electrode structure overlies the channel structure. A second ferroelectric structure overlies the second floating electrode structure. An upper gate electrode overlies the second ferroelectric structure.

In some embodiments, the present application provides an integrated chip (IC). The IC comprises a lower gate electrode disposed in a dielectric structure. A first ferroelectric structure overlies the lower gate electrode. A first floating electrode structure overlies the first ferroelectric structure. A first source/drain (S/D) structure is disposed on a first side of the first ferroelectric structure. A second S/D structure is disposed on a second side of the first ferroelectric structure opposite the first side of the first ferroelectric structure. A channel structure overlies the first floating electrode structure, the first S/D structure, and the second S/D structure, wherein the first S/D structure and the second S/D structure are electrically coupled to the channel structure. A second floating electrode structure overlies the channel structure. A second ferroelectric structure overlies the second floating electrode structure. An upper gate electrode overlies the second ferroelectric structure. A third S/D structure overlies the channel structure and is disposed on a first side of the second ferroelectric structure, wherein the third S/D structure is electrically coupled to the channel structure. A fourth S/D structure overlies the channel structure and is disposed on a second side of the second ferroelectric structure opposite the first side of the second ferroelectric structure, wherein the fourth S/D structure is electrically coupled to the channel structure.

In some embodiments, the present application provides a method. The method comprises forming a first ferroelectric layer over a lower gate electrode structure. A first floating electrode layer is formed over the first ferroelectric layer. A channel structure is formed over the first floating electrode layer. A second floating electrode layer is formed over the channel structure. A second ferroelectric layer is formed over the second floating electrode layer. A first opening is formed that extends vertically through both the second ferroelectric layer and the second floating electrode layer, wherein the first opening exposes a first portion of the channel structure. A second opening is formed that extends vertically through both the second ferroelectric layer and the second floating electrode layer, wherein the second opening exposes a second portion of the channel structure that is laterally spaced from the first portion of the channel structure. A first source/drain (S/D) structure is formed in the first opening. A second S/D structure is formed in the second opening. An upper gate electrode is formed over the channel structure and laterally between the first S/D structure and the second S/D structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
   a lower gate electrode disposed in a dielectric structure;
   a first ferroelectric structure overlying the lower gate electrode;
   a first floating electrode structure overlying the first ferroelectric structure;
   a channel structure overlying the first floating electrode structure;
   a second floating electrode structure overlying the channel structure;
   a second ferroelectric structure overlying the second floating electrode structure; and
   an upper gate electrode overlying the second ferroelectric structure.

2. The IC of claim 1, further comprising:
   a first source/drain (S/D) structure overlying the channel structure; and
   a second S/D structure overlying the channel structure and laterally spaced from the first S/D structure, wherein the upper gate electrode is disposed laterally between the first S/D structure and the second S/D structure, and wherein the first S/D structure and the second S/D structure are electrically coupled to the channel structure.

3. The IC of claim 2, wherein the lower gate electrode is disposed laterally between the first S/D structure and the second S/D structure.

4. The IC of claim 2, wherein the first ferroelectric structure is disposed laterally between the first S/D structure and the second S/D structure.

5. The IC of claim 2, wherein the first floating electrode structure is disposed laterally between the first S/D structure and the second S/D structure.

6. The IC of claim 2, further comprising:
   a first spacer structure disposed along outer sidewalls of the first S/D structure, wherein the first spacer structure is disposed laterally between the first S/D structure and the second floating electrode structure; and
   a second spacer structure disposed along outer sidewalls of the second S/D structure, wherein the second spacer structure is disposed laterally between the second S/D structure and the second floating electrode structure.

7. The IC of claim 6, wherein the lower gate electrode is disposed laterally between the first spacer structure and the second spacer structure.

8. The IC of claim 6, wherein the first ferroelectric structure is disposed laterally between the first spacer structure and the second spacer structure.

9. The IC of claim 6, wherein the first floating electrode structure is disposed laterally between the first spacer structure and the second spacer structure.

10. The IC of claim 1, wherein the upper gate electrode overlies the lower gate electrode, the first ferroelectric structure, and the first floating electrode structure.

11. The IC of claim 10, wherein the upper gate electrode overlies the second floating electrode structure.

12. An integrated chip (IC), the IC comprising:
a lower gate electrode disposed in a dielectric structure;
a first ferroelectric structure overlying the lower gate electrode;
a first floating electrode structure overlying the first ferroelectric structure;
a first source/drain (S/D) structure disposed on a first side of the first ferroelectric structure;
a second S/D structure disposed on a second side of the first ferroelectric structure opposite the first side of the first ferroelectric structure;
a channel structure overlying the first floating electrode structure, the first S/D structure, and the second S/D structure, wherein the first S/D structure and the second S/D structure are electrically coupled to the channel structure;
a second floating electrode structure overlying the channel structure;
a second ferroelectric structure overlying the second floating electrode structure;
an upper gate electrode overlying the second ferroelectric structure;
a third S/D structure overlying the channel structure and disposed on a first side of the second ferroelectric structure, wherein the third S/D structure is electrically coupled to the channel structure; and
a fourth S/D structure overlying the channel structure and disposed on a second side of the second ferroelectric structure opposite the first side of the second ferroelectric structure, wherein the fourth S/D structure is electrically coupled to the channel structure.

13. The IC of claim 12, wherein:
the first ferroelectric structure is disposed laterally between the first S/D structure and the second S/D structure and laterally between the third S/D structure and the fourth S/D structure; and
the second ferroelectric structure is disposed laterally between the first S/D structure and the second S/D structure and laterally between the third S/D structure and the fourth S/D structure.

14. The IC of claim 12, wherein:
the first floating electrode structure is disposed laterally between the first S/D structure and the second S/D structure and laterally between the third S/D structure and the fourth S/D structure; and
the second floating electrode structure is disposed laterally between the first S/D structure and the second S/D structure and laterally between the third S/D structure and the fourth S/D structure.

15. The IC of claim 12, wherein:
the third S/D structure overlies the first S/D structure; and
the fourth S/D structure overlies the second S/D structure.

16. The IC of claim 12, further comprising:
a first spacer structure disposed along outer sidewalls of the first S/D structure, wherein the first spacer structure is disposed laterally between the first S/D structure and the first floating electrode structure;
a second spacer structure disposed along outer sidewalls of the second S/D structure, wherein the second spacer structure is disposed laterally between the second S/D structure and the first floating electrode structure;
a third spacer structure disposed along outer sidewalls of the third S/D structure, wherein the third spacer structure is disposed laterally between the third S/D structure and the second floating electrode structure; and
a fourth spacer structure disposed along outer sidewalls of the fourth S/D structure, wherein the fourth spacer structure is disposed laterally between the fourth S/D structure and the second floating electrode structure.

17. The IC of claim 16, wherein:
an outer perimeter of the third spacer structure overlaps an outer perimeter of the first spacer structure; and
an outer perimeter of the fourth spacer structure overlaps an outer perimeter of the second spacer structure.

18. An integrated chip (IC), comprising:
a first ferroelectric layer disposed over a lower gate electrode structure;
a first floating electrode layer disposed over the first ferroelectric layer;
a channel structure disposed over the first floating electrode layer;
a second floating electrode layer over the channel structure;
a second ferroelectric layer over the second floating electrode layer;
a first source/drain (S/D) structure that extends vertically through both the second ferroelectric layer and the second floating electrode layer and reaches on a first portion of the channel structure;
a second S/D structure that extends vertically through both the second ferroelectric layer and the second floating electrode layer reaches on a second portion of the channel structure that is laterally spaced from the first portion of the channel structure; and
an upper gate electrode disposed over the channel structure and laterally between the first S/D structure and the second S/D structure.

19. The IC of claim 18, further comprising:
a first spacer structure lining sidewalls of the first S/D structure; and
a second spacer structure lining sidewalls of the second S/D structure.

20. The IC of claim 18, further comprising:
a third S/D structure that extends vertically through both the first ferroelectric layer and the first floating electrode layer, wherein the third S/D structure is on a first side of the lower gate electrode structure; and
a fourth S/D structure that extends vertically through both the first ferroelectric layer and the first floating electrode layer, wherein the fourth S/D structure is on a second side of the lower gate electrode structure opposite the first side of the lower gate electrode structure;
wherein the channel structure overlies both the third S/D structure and the fourth S/D structure.

* * * * *